United States Patent
Toyotaka et al.

(10) Patent No.: US 11,013,087 B2
(45) Date of Patent: May 18, 2021

(54) LIGHT-EMITTING DEVICE HAVING CIRCUITS AND METHOD FOR DRIVING THE SAME

(71) Applicant: Semiconductor Energy Laboratory Co., Ltd., Atsugi (JP)

(72) Inventors: Kouhei Toyotaka, Atsugi (JP); Koji Kusunoki, Kawasaki (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 13/783,809

(22) Filed: Mar. 4, 2013

(65) Prior Publication Data

US 2013/0241431 A1    Sep. 19, 2013

(30) Foreign Application Priority Data

Mar. 13, 2012  (JP) .............................. JP2012-055269
Nov. 30, 2012  (JP) .............................. JP2012-261864

(51) Int. Cl.
*G11C 19/28*    (2006.01)
*H05B 47/10*    (2020.01)
(Continued)

(52) U.S. Cl.
CPC .......... *H05B 47/10* (2020.01); *G09G 3/3233* (2013.01); *G09G 3/3266* (2013.01); *G11C 19/28* (2013.01);
(Continued)

(58) Field of Classification Search
CPC .... G09G 3/3233; G09G 3/3241; G09G 3/325; G09G 3/3258; G09G 3/32;
(Continued)

(56) References Cited

U.S. PATENT DOCUMENTS 5,155,613 A    10/1992    Sakayori
5,534,884 A    7/1996    Mase et al.
(Continued)

FOREIGN PATENT DOCUMENTS

CN    1831918    9/2006
CN    101069226    11/2007
(Continued)

OTHER PUBLICATIONS

International Search Report (Application No. PCT/JP2013/055613) dated Jun. 4, 2013.
(Continued)

*Primary Examiner* — Jennifer Mehmood
*Assistant Examiner* — James S Nokham
(74) *Attorney, Agent, or Firm* — Robinson Intellectual Property Law Office; Eric J. Robinson

(57) ABSTRACT

Provided is a light-emitting device which can prevent appearance of an after-image after power on. Before or after supply of a power voltage applied to a light-emitting element is cut, a potential of a gate electrode of a transistor controlling the supply of the power voltage to the light-emitting element is initialized. Specifically, in the case where the transistor is n-channel type, the potential of the gate electrode is initialized so that a gate voltage is equal to or lower than a threshold voltage. In the case where the transistor is p-channel type, the potential of the gate electrode is initialized so that the gate voltage is equal to or higher than the threshold voltage.

20 Claims, 24 Drawing Sheets

(51) Int. Cl.
  *G09G 3/3233* (2016.01)
  *G09G 3/3266* (2016.01)
(52) U.S. Cl.
  CPC ............ *G09G 2300/0819* (2013.01); *G09G 2300/0861* (2013.01); *G09G 2310/0245* (2013.01); *G09G 2310/0251* (2013.01); *G09G 2310/0262* (2013.01); *G09G 2310/0286* (2013.01); *G09G 2320/0257* (2013.01); *G09G 2320/043* (2013.01); *G09G 2330/026* (2013.01); *G09G 2330/027* (2013.01)
(58) Field of Classification Search
  CPC ....... G09G 2320/043; G09G 2320/045; G09G 3/30; G09G 3/006; H03K 19/177
  USPC .................. 345/76–88, 211–213, 36, 45–46; 315/224; 326/44
  See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,767,832 | A | 6/1998 | Koyama et al. |
| 5,982,471 | A | 11/1999 | Hirakata et al. |
| 6,169,532 | B1 | 1/2001 | Sumi et al. |
| 6,266,038 | B1 | 7/2001 | Yoshida et al. |
| 6,294,274 | B1 | 9/2001 | Kawazoe et al. |
| 6,563,174 | B2 | 5/2003 | Kawasaki et al. |
| 6,621,489 | B2 | 9/2003 | Yanagisawa et al. |
| 6,727,522 | B1 | 4/2004 | Kawasaki et al. |
| 6,961,042 | B2 | 11/2005 | Murai |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,098,880 | B2 | 8/2006 | Inoue et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,286,108 | B2 | 10/2007 | Tsuda et al. |
| 7,297,977 | B2 | 11/2007 | Hoffman et al. |
| 7,321,353 | B2 | 1/2008 | Tsuda et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,737,517 | B2 | 6/2010 | Kawamura et al. |
| 7,791,072 | B2 | 9/2010 | Kumomi et al. |
| 7,791,074 | B2 | 9/2010 | Iwasaki |
| 7,859,525 | B2 | 12/2010 | Takatori et al. |
| 7,924,276 | B2 | 4/2011 | Tsuda et al. |
| 7,973,670 | B2 | 7/2011 | Iwabuchi et al. |
| 8,067,775 | B2 | 11/2011 | Miyairi et al. |
| 8,094,099 | B2 | 1/2012 | Uchino et al. |
| 8,158,979 | B2 | 4/2012 | Kang et al. |
| 8,222,092 | B2 | 7/2012 | Yamazaki et al. |
| 8,243,055 | B2 | 8/2012 | Abe |
| 8,325,310 | B2 | 12/2012 | Ishitani |
| 8,368,622 | B2 | 2/2013 | Uchino et al. |
| 8,654,041 | B2 | 2/2014 | Kang et al. |
| 9,041,746 | B2 | 5/2015 | Byun |
| 9,136,390 | B2 | 9/2015 | Yamazaki et al. |
| 9,520,411 | B2 | 12/2016 | Takahashi et al. |
| 10,332,912 | B2 | 6/2019 | Takahashi et al. |
| 2001/0020928 | A1 | 9/2001 | Yanagisawa et al. |
| 2001/0046027 | A1 | 11/2001 | Tai et al. |
| 2002/0003271 | A1 | 1/2002 | Ikeda et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0219188 | A1 | 10/2005 | Kawabe et al. |
| 2006/0022932 | A1 | 2/2006 | Sagawa et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208976 | A1 | 9/2006 | Ikeda |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0244695 | A1* | 11/2006 | Komiya ................. G09G 3/006 345/76 |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0205976 | A1 | 9/2007 | Takatori et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0001863 | A1 | 1/2008 | Kim et al. |
| 2008/0006877 | A1 | 1/2008 | Mardilovich et al. |
| 2008/0007547 | A1 | 1/2008 | Hasumi et al. |
| 2008/0038882 | A1 | 2/2008 | Takechi et al. |
| 2008/0038929 | A1 | 2/2008 | Chang |
| 2008/0042968 | A1 | 2/2008 | Oh |
| 2008/0050595 | A1 | 2/2008 | Nakagawara et al. |
| 2008/0055218 | A1 | 3/2008 | Tsuda et al. |
| 2008/0073653 | A1 | 3/2008 | Iwasaki |
| 2008/0083950 | A1 | 4/2008 | Pan et al. |
| 2008/0100595 | A1 | 5/2008 | Wu et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0198111 | A1* | 8/2008 | Yamashita ........... G09G 3/3233 345/87 |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0284970 | A1 | 11/2008 | Ishitani |
| 2008/0296568 | A1 | 12/2008 | Ryu et al. |
| 2009/0001881 | A1 | 1/2009 | Nakayama |
| 2009/0066616 | A1* | 3/2009 | Uchino et al. ................. 345/77 |
| 2009/0068773 | A1 | 3/2009 | Lai et al. |

(56) References Cited

U.S. PATENT DOCUMENTS

| | | | |
|---|---|---|---|
| 2009/0073325 A1 | 3/2009 | Kuwabara et al. | |
| 2009/0079684 A1 | 3/2009 | Watanabe | |
| 2009/0114910 A1 | 5/2009 | Chang | |
| 2009/0134399 A1 | 5/2009 | Sakakura et al. | |
| 2009/0135112 A1* | 5/2009 | Uchino | G09G 3/3233 345/76 |
| 2009/0152506 A1 | 6/2009 | Umeda et al. | |
| 2009/0152541 A1 | 6/2009 | Maekawa et al. | |
| 2009/0184902 A1* | 7/2009 | Tomida | G09G 3/3233 345/77 |
| 2009/0261325 A1 | 10/2009 | Kawamura et al. | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0171685 A1* | 7/2010 | Kimura | G09G 3/3233 345/76 |
| 2010/0171738 A1* | 7/2010 | Yamashita | G09G 3/3258 345/213 |
| 2010/0244020 A1 | 9/2010 | Sakata et al. | |
| 2011/0090202 A1* | 4/2011 | Han | G09G 3/32 345/211 |
| 2011/0133196 A1 | 6/2011 | Yamazaki et al. | |
| 2011/0148826 A1 | 6/2011 | Koyama et al. | |
| 2011/0148846 A1 | 6/2011 | Arasawa et al. | |
| 2011/0175646 A1* | 7/2011 | Takemura et al. | 326/44 |
| 2011/0175883 A1 | 7/2011 | Toyotaka et al. | |
| 2011/0175894 A1 | 7/2011 | Wakimoto et al. | |
| 2011/0193768 A1* | 8/2011 | Choi | G09G 3/3233 345/76 |
| 2011/0210328 A1 | 9/2011 | Yamazaki et al. | |
| 2011/0212571 A1 | 9/2011 | Yamazaki et al. | |
| 2011/0215318 A1 | 9/2011 | Yamazaki et al. | |
| 2012/0019569 A1 | 1/2012 | Byun | |
| 2012/0061668 A1 | 3/2012 | Miyairi et al. | |
| 2012/0120042 A1* | 5/2012 | Tsai | G09G 3/3233 345/211 |
| 2012/0146999 A1* | 6/2012 | Hwang | G09G 3/003 345/419 |
| 2013/0002637 A1 | 1/2013 | Hasumi et al. | |
| 2013/0141412 A1* | 6/2013 | Kang | G09G 3/3233 345/212 |
| 2013/0169663 A1* | 7/2013 | Seong | G09G 5/00 345/589 |
| 2013/0215092 A1* | 8/2013 | Wu | G09G 3/3233 345/206 |
| 2016/0005876 A1 | 1/2016 | Yamazaki et al. | |

FOREIGN PATENT DOCUMENTS

| | | |
|---|---|---|
| CN | 101097690 | 1/2008 |
| CN | 101174377 | 5/2008 |
| CN | 101388172 A | 3/2009 |
| CN | 101447169 A | 6/2009 |
| CN | 101515433 | 8/2009 |
| CN | 102714023 | 10/2012 |
| DE | 102007029832 | 1/2008 |
| EP | 1737044 A | 12/2006 |
| EP | 1804229 A | 7/2007 |
| EP | 2192571 A | 6/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-090317 A | 4/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-131633 A | 5/2003 |
| JP | 2004-103957 A | 4/2004 |
| JP | 2004-191697 A | 7/2004 |
| JP | 2004-273614 A | 9/2004 |
| JP | 2004-273732 A | 9/2004 |
| JP | 2005-106998 A | 4/2005 |
| JP | 2005-157157 A | 6/2005 |
| JP | 2005-208261 A | 8/2005 |
| JP | 2006-165527 A | 6/2006 |
| JP | 2006-251453 A | 9/2006 |
| JP | 2007-096055 A | 4/2007 |
| JP | 2007-199701 A | 8/2007 |
| JP | 2008-015513 A | 1/2008 |
| JP | 2008-116934 A | 5/2008 |
| JP | 2008-176287 A | 7/2008 |
| JP | 2009-031750 A | 2/2009 |
| JP | 2009-042263 A | 2/2009 |
| JP | 2009-186542 A | 8/2009 |
| JP | 2009-271392 A | 11/2009 |
| JP | 2010-128491 A | 6/2010 |
| JP | 2011-100092 A | 5/2011 |
| JP | 2011-139053 A | 7/2011 |
| JP | 2011-141529 A | 7/2011 |
| JP | 2011-170327 A | 9/2011 |
| KR | 10-0702094 B | 3/2007 |
| KR | 2007-0091165 A | 9/2007 |
| KR | 2008-0002131 A | 1/2008 |
| KR | 2012-0009887 A | 2/2012 |
| KR | 2012-0107107 A | 9/2012 |
| KR | 2012-0118473 A | 10/2012 |
| TW | I237229 | 8/2005 |
| TW | I277943 | 4/2007 |
| TW | 200717387 | 5/2007 |
| TW | 200816143 | 4/2008 |
| TW | 200820197 | 5/2008 |
| TW | I321310 | 3/2010 |
| TW | 201137843 | 11/2011 |
| TW | 201138112 | 11/2011 |
| TW | 201145407 | 12/2011 |
| WO | WO-2004/114391 | 12/2004 |
| WO | WO-2006/070833 | 7/2006 |
| WO | WO-2008/075697 | 6/2008 |
| WO | WO-2011/058885 | 5/2011 |
| WO | WO-2011/068022 | 6/2011 |
| WO | WO-2011/089842 | 7/2011 |

OTHER PUBLICATIONS

Written Opinion (Application No. PCT/JP2013/055613) dated Jun. 4, 2013.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Hayashi.R et al., "42.1: Invited Paper:. Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38,, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chinese Office Action (Application No. 201380013921.5) dated Jan. 28, 2016.

Taiwanese Office Action (Application No. 102107857) dated Oct. 24, 2016.

Taiwanese Office Action (Application No. 102107857) dated Feb. 22, 2017.

Taiwanese Office Action (Application No. 106122407) dated Dec. 12, 2017.

* cited by examiner

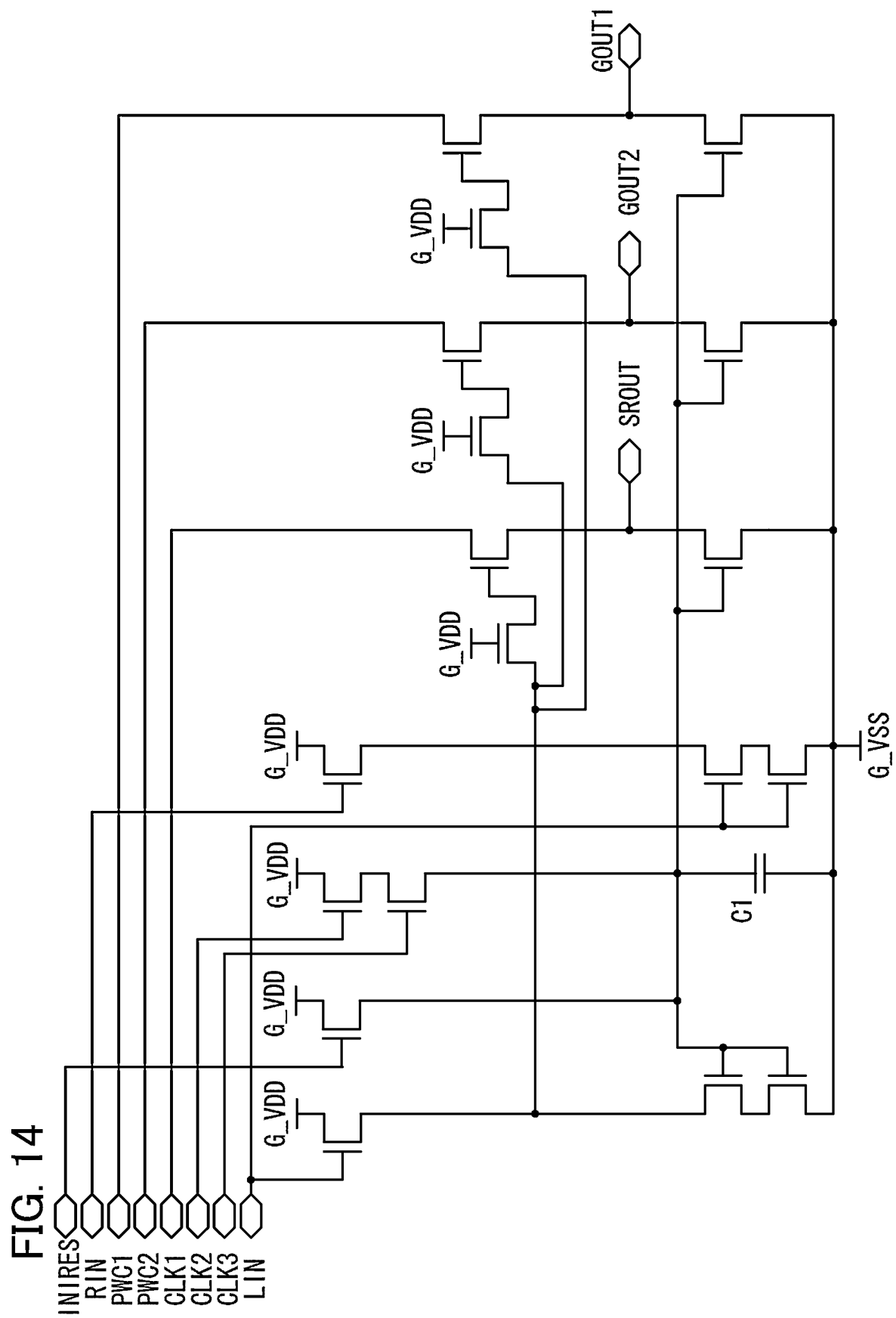

LIGHT-EMITTING DEVICE HAVING CIRCUITS AND METHOD FOR DRIVING THE SAME

TECHNICAL FIELD

The present invention relates to matter, a method, a manufacturing method, a process, a machine, manufacture, or composition of matter. In particular, the present invention relates to a semiconductor device, a display device, a light-emitting device, a method for driving them, or a method for manufacturing them, for example. In particular, the present invention relates to a light-emitting device in which one or more transistor is provided in each pixel and a driving method thereof, for example.

BACKGROUND ART

Since light-emitting devices using light-emitting elements have high visibility, are suitable for reduction in thickness, and do not have limitations on viewing angle, they have attracted attention as display devices which are alternatives to CRTs (cathode ray tube) or liquid crystal display devices. Specifically proposed structures of active matrix display devices using light-emitting elements are different depending on manufacturers. In general, a pixel includes at least a light-emitting element, a transistor that controls input of image signals to the pixel (a switching transistor), and a transistor that controls the amount of current supplied to the light-emitting element (a driving transistor).

In recent years, a metal oxide having semiconductor characteristics, which is called an oxide semiconductor, has attracted attention as a novel semiconductor having high mobility as in the case of polysilicon or microcrystalline silicon and having uniform element characteristics as in the case of amorphous silicon. Oxide semiconductors can be deposited on a substrate which has a low strain point, such as a glass substrate, and can be used for a large substrate of the fifth generation (one side of which exceeds 1000 mm) or later generation. Further, a light-emitting device in which the oxide semiconductor is used for a transistor in a pixel instead of a conventional semiconductor such as silicon or germanium is being put to practical use.

Patent Document 1 describes an organic EL display device in which an active layer of a TFT for driving an organic EL element contains an oxide semiconductor. Patent Document 2 describes an organic electroluminescent display device in which an active layer of a thin film transistor is formed using an oxide semiconductor.

REFERENCE

Patent Documents

[Patent Document 1] Japanese Published Patent Application No. 2009-031750
[Patent Document 2] Japanese Published Patent Application No. 2011-100092

DISCLOSURE OF INVENTION

A transistor containing an oxide semiconductor which is highly purified by reducing impurities such as moisture and hydrogen, which function as electron donors, and by reducing oxygen defects, has a characteristic of an extremely small off-state current. By using the transistor having the characteristic for a pixel of a light-emitting device, luminance of a light-emitting element can be prevented from being changed caused by the potential change in a gate electrode of a driver transistor after input of an image signal is completed. However, in the above light-emitting device, the potential of the image signal is likely to be held in the gate electrode of the driver transistor even after power supply of the light-emitting device is cut. For this reason, in the light-emitting device, an image displayed just before power supply is cut may be displayed as an after-image also after power on.

In view of the foregoing technical background, an object of the present invention is to provide a light-emitting device which can prevent appearance of an after-image after power on. An object of the present invention is to provide a method for driving a light-emitting device which can prevent appearance of an after-image after power on.

Note that the descriptions of these problems do not disturb the existence of other problems. In one embodiment of the present invention, there is no need to achieve all the objects. Other objects will be apparent from and can be derived from the description of the specification, the drawings, the claims, and the like.

In a light-emitting device according to one embodiment of the present invention, before or after supply of a power voltage applied to a light-emitting element is cut, a potential of a gate electrode of a transistor for controlling the supply of the power voltage to the light-emitting element is initialized. Specifically, in the case where the transistor is n-channel type, a potential difference (gate voltage) between the gate electrode and a source terminal is decreased to or below a threshold voltage in order to initialize the potential of the gate electrode. In the case where the transistor is p-channel type, the gate voltage is increased to or over the threshold voltage in order to initialize the potential of the gate electrode.

By initializing the potential of the gate electrode of the transistor, a potential of a signal containing image data is not held in the gate electrode and the transistor can be completely turned off (out of conduction). Thus, current can be prevented from flowing to the light-emitting element through the transistor after the power voltage applied to the light-emitting element is applied to the pixel. Accordingly, in a light-emitting device in which a transistor having an extremely small off-state current such as a transistor containing an oxide semiconductor is used, appearance of an after-image can be prevented before the signal containing image data is input to a pixel after power on.

Specifically, a light-emitting device according to one embodiment of the present invention includes a panel; a controller selecting one of a first signal and a second signal which contains image data and sending the selected signal to the panel; and a power supply circuit supplying a power voltage to the panel in response to an instruction from the controller when the second signal is selected by the controller and sent to the panel, and cutting the supply of the power voltage to the panel in response to an instruction from the controller after the first signal is selected by the controller and sent to the panel. The panel includes a plurality of pixels. The plurality of pixels each include a first transistor, a second transistor whose gate electrode is applied with the first signal or the second signal through the first transistor and which is turned off when the first signal is applied to the gate electrode, and a light-emitting element which is applied with the power voltage through the second transistor.

Specifically, a light-emitting device according to one embodiment of the present invention includes a panel; a controller selecting one of a first signal and a second signal which contains image data and sending the selected signal to the panel; and a power supply circuit providing supply of a power voltage to the panel in response to an instruction from the controller after the first signal is selected by the controller and sent to the panel before the second signal is selected by the controller and sent to the panel. The panel includes a plurality of pixels. The plurality of pixels each include a first transistor, a second transistor whose gate electrode is applied with the first signal or the second signal through the first transistor and which is turned off when the first signal is applied to the gate electrode, and a light-emitting element which is applied with the power voltage through the second transistor.

Specifically, in a method for driving a light-emitting device according to one embodiment of the present invention, before supply of a power voltage to a pixel is cut, a gate electrode of a transistor for controlling supply of the power voltage to a light-emitting element in the pixel is applied with a signal to turn the transistor off.

Specifically, in a method for driving a light-emitting device according to one embodiment of the present invention, before supply of a power voltage to a pixel is provided, a gate electrode of a transistor for controlling supply of the power voltage to a light-emitting element in the pixel is applied with a signal to turn the transistor off.

According to one embodiment of the present invention, a light-emitting device in which appearance of an after-image after power on is prevented can be obtained. According to one embodiment of the present invention, a method for driving a light-emitting device in which appearance of an after-image after power on is prevented can be obtained.

BRIEF DESCRIPTION OF DRAWINGS

FIG. 14 is a circuit diagram of a shift register.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Embodiment 1

Figure 1A:
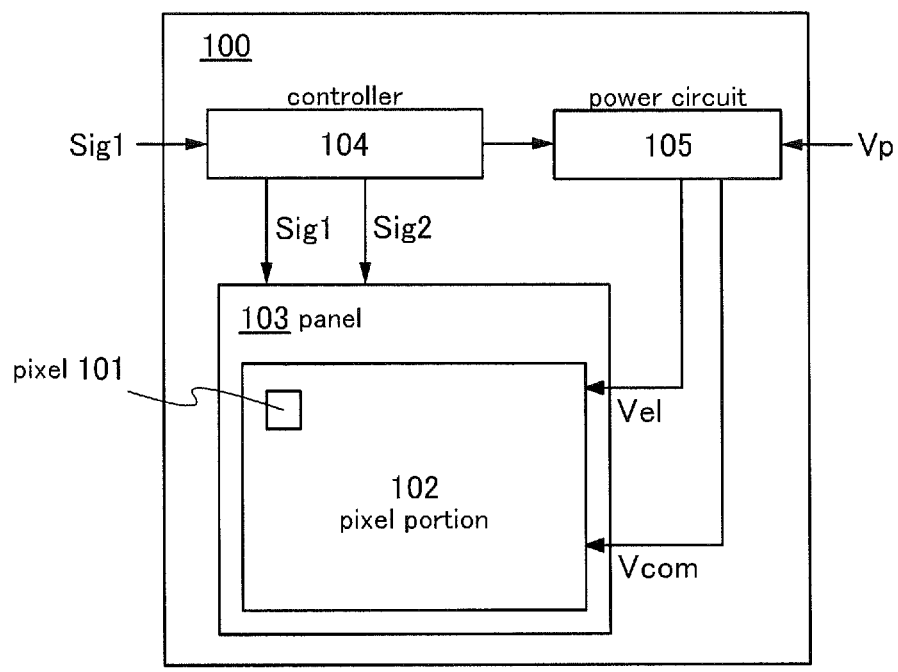
FIGS. 1A and 1B illustrate the structures of a light-emitting device and a pixel.

A configuration example of a light-emitting device according to one embodiment of the present invention is shown in a block diagram of FIG. 1A. Although the block diagram shows elements classified according to their functions in independent blocks, it may be practically difficult to completely classify the elements according to their functions and, in some cases, one element may have a plurality of functions.

A light-emitting device 100 in FIG. 1A includes at least a panel 103 having a plurality of pixels 101 in a pixel portion 102, a controller 104, and a power supply circuit 105.

Each of the pixels 101 includes a light-emitting element and a transistor for controlling operation of the light-emitting element. The panel 103 includes, in addition to the pixel portion 102, various driver circuits for controlling operation of the pixel portion 102.

When a signal Sig1 containing image data is input to the controller 104, the controller 104 has a function of processing the signal Sig1 in accordance with the specification of the panel 103 and then supplying the processed signal Sig1 to the panel 103. In addition, the controller 104 has a function of generating a signal Sig2 containing no image data and supplies the signal to the panel 103. The controller 104 determines whether the signal Sig1 or the signal Sig2 is applied to the panel 103.

The power supply circuit 105 has a function of generating a power voltage from a power voltage Vp input to the light-emitting device 100; the power voltage is supplied to the panel 103, the controller 104, and other various circuits in the light-emitting device 100. In addition, the power supply circuit 105 has a function of supplying the power voltage applied to the light-emitting element to each of the plurality of pixels 101 included in the pixel portion 102. Specifically, in FIG. 1A, the potential difference between a fixed potential Vcom (e.g., ground potential) and a potential Vel is supplied as the power voltage to each of the plurality of pixels 101. The controller 104 has a function of determining whether the power supply circuit 105 supplies the power voltage to the plurality of pixels 101.

Note that the power supply circuit 105 may have a function of controlling supply of the power voltage to various driver circuits included in the panel 103. Alternatively, the power supply circuit 105 may have a function of supplying a power voltage other than the power voltage supplied to the light-emitting element, to the pixel portion 102.

Figure 1B:
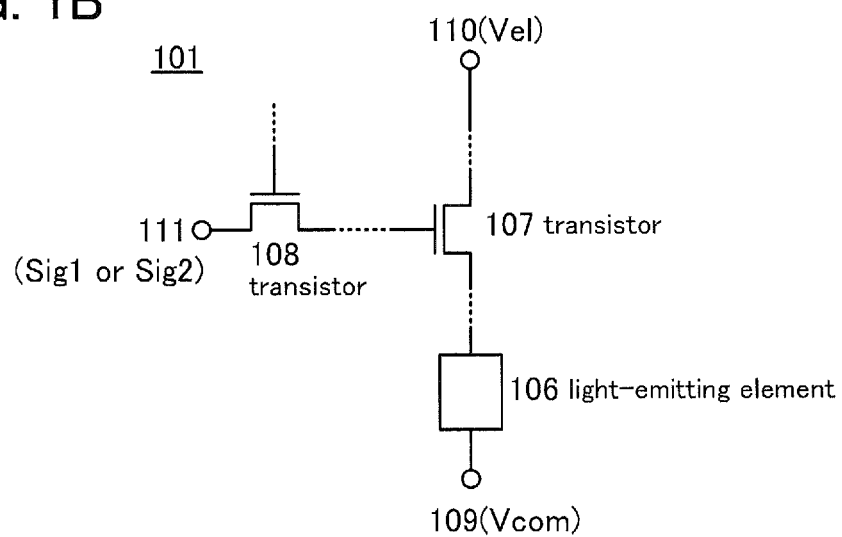

Next, FIG. 1B shows a specific configuration example of the pixel 101. The pixel 101 in FIG. 1B includes at least a light-emitting element 106, a transistor 107, and a transistor 108.

Examples of the light-emitting element 106 include an element of which luminance is controlled by current or voltage. For example, an OLED or the like can be used as the light-emitting element 106. An OLED includes at least an EL layer, an anode, and a cathode. The EL layer is formed using a single layer or plural layers provided between the anode and the cathode, at least one of which is a light-emitting layer containing a light-emitting substance. From the EL layer, electroluminescence is obtained by current supplied when a potential difference between the cathode and the anode, using the potential of the cathode as a reference potential, is higher than or equal to a threshold voltage V the of the light-emitting element 106. As electroluminescence, there are luminescence (fluorescence) at the time of returning from a singlet-excited state to a ground state and luminescence (phosphorescence) at the time of returning from a triplet-excited state to a ground state.

The transistor 107 has a function of controlling supply of a power voltage corresponding to the potential difference between the potential Vcom and the potential Vel, to the light-emitting element 106. That is, the power voltage is supplied to the light-emitting element 106 through the transistor 107.

The transistor 108 has a function of controlling input of the signal Sig1 or the signal Sig2 which is applied to the panel 103 by the controller 104, to a gate electrode of the transistor 107.

Specifically, in the pixel 101, one of a source terminal and a drain terminal of the transistor 107 is connected to a wiring 110 applied with the potential Vel, and the other thereof is connected to one of an anode and a cathode of the light-emitting element 106. The other of the anode and the cathode of the light-emitting element 106 is connected to a wiring 109 applied with the potential Vcom. In addition, one of a source terminal and a drain terminal of the transistor 108 is connected to a wiring 111 applied with the potential of the signal Sig1 or the signal Sig2, and the other thereof is connected to the gate electrode of the transistor 107. A gate electrode of the transistor 108 is applied with a signal for turning on/off the transistor 108.

Note that the term "connection" in this specification refers to electrical connection and corresponds to the state in which current, a potential, or voltage can be supplied or transmitted. Therefore, a state of electrical connection means not only a state of direct connection but also a state of indirect connection through a circuit element such as a resistor, a diode, a transistor, an inductor, or a capacitor in which current, voltage, or a potential can be supplied or transmitted. Thus, the pixel 101 may further include another circuit element such as a transistor, a diode, a resistor, a capacitor, or an inductor as needed.

In addition, even when different components are connected to each other in a circuit diagram, there is actually a case where one conductive film has functions of a plurality of components, such as a case where part of a wiring serves as an electrode. In this specification, the term "connection" also means such a case where one conductive film has functions of a plurality of components.

In addition, a "source terminal" of a transistor means a source region that is a part of an active layer or a source electrode connected to an active layer. Similarly, "drain terminal" of a transistor means a drain region that is a part of an active layer or a drain electrode connected to an active layer.

Note that the terms "source terminal" and "drain terminal" of a transistor interchange with each other depending on the channel type of the transistor or the potential levels applied to the source terminal and the drain terminal. In general, as for a source terminal and a drain terminal in an n-channel transistor, one to which a lower potential is applied is called a source terminal, and one to which a higher potential is applied is called a drain terminal. As for a source terminal and a drain terminal in a p-channel transistor, one to which a lower potential is supplied is called a drain terminal, and one to which a higher potential is supplied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

In one embodiment of the present invention, the signal Sig1 containing image data is applied to the wiring 111 in a normal operation state for displaying an image in the pixel portion 102. Further, before supply of the power voltage to the pixels 101 is cut (i.e., before transition from the normal operation state to a non-operation state), or in the non-operation state after the supply of the power voltage to the pixels 101 is cut, the signal Sig2 containing no image data is applied to the wiring 111.

An operation example of the pixel 101 shown in FIG. 1B is described with reference to FIGS. 2A to 2D. FIGS. 2A to 2D schematically show operation of the pixel 101. FIGS. 2A to 2D each show an example in which a capacitor 112 for holding the gate voltage of the transistor 107 is included in the pixel 101. Note that the capacitor 112 is not necessarily provided in the pixel 101 in the case where the gate capacitance formed between the gate electrode of the transistor 107 and an active layer or the parasitic capacitance of the gate electrode is large enough. In addition, the transistor 108 is illustrated as a switch in FIGS. 2A to 2D.

Figure 2A:
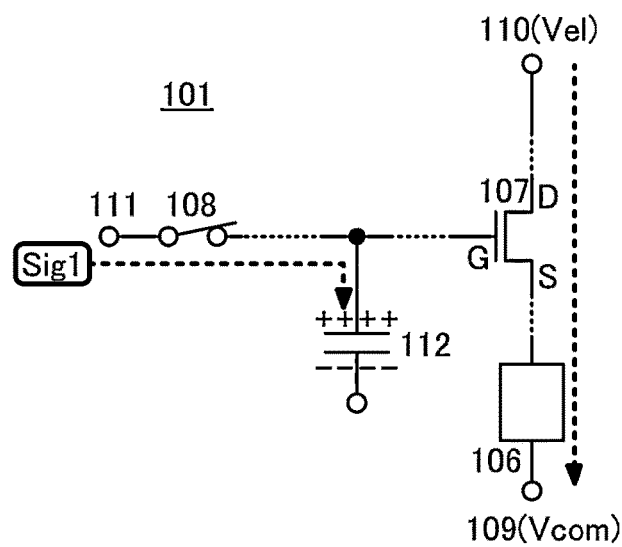
FIGS. 2A to 2D illustrate the operation of a pixel.

FIG. 2A schematically shows operation of the pixel 101 in the case where the signal Sig1 containing image data is input to the pixel 101. In FIG. 2A, the potential of the signal Sig1 is applied to the gate electrode of the transistor 107 from the wiring 111 through the transistor 108 being ON. Charges are accumulated in the capacitor 112 according to the potential. In the case where the power voltage is applied between the wiring 109 and the wiring 110, a value of a drain current of the transistor 107 is determined according to the potential of the signal Sig1, and the luminance of the light-emitting element 106 is determined according to the value of the drain current.

Figure 2B:
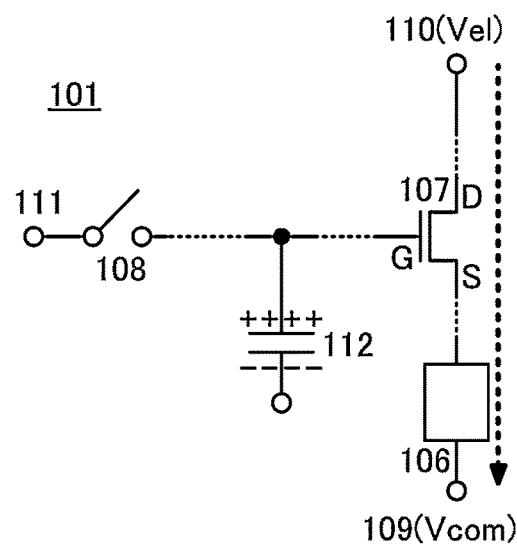

FIG. 2B schematically shows operation of the pixel 101 when the signal Sig1 is held in the pixel 101. In FIG. 2B, the transistor 108 is turned off, whereby the wiring 111 is electrically separated from the gate electrode of the transistor 107. Accordingly, the accumulated charges are held in the capacitor 112 and the potential of the gate electrode of the transistor 107 is also held. When the power voltage is applied between the wiring 109 and the wiring 110, the value of the drain current of the transistor 107 determined according to the potential of the signal Sig1 and the luminance of the light-emitting element 106 are held even after the transistor 108 is turned off.

In the case where the off-state current of the transistor 108 is extremely small, the charges held in the capacitor 112 can be prevented from being leaked through the transistor 108. In this case, after the transistor 108 is turned off to complete the input of the signal Sig1 to the pixel 101, the potential of the gate electrode of the transistor 107 is hardly changed; thus, luminance of the light-emitting element 106 can be prevented from being changed.

Figure 2C:
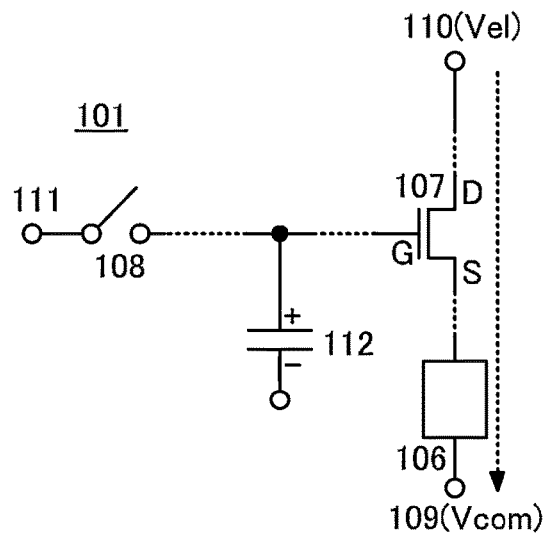

Note that in the case where the off-state current of the transistor 108 is extremely small, the charges accumulated in the capacitor 112 may be kept held after supply of the power voltage Vp to the light-emitting device 100 shown in FIG. 1A is cut. FIG. 2C schematically shows operation of the pixel 101 in the case where the charges are accumulated in the capacitor 112 after supply of the power voltage Vp is cut. The transistor 107 is ON in FIG. 2C; thus, when the supply of the power voltage Vp to the light-emitting device 100 is provided again and the power voltage is applied between the wiring 109 and the wiring 110 in the pixel 101, current is supplied to the light-emitting element 106. As a result, an image displayed in the pixel portion 102 by the signal Sig1 before supply of the power voltage Vp is cut is displayed in the pixel portion 102 as an after-image also after supply of the power voltage Vp is provided again.

Thus, in one embodiment of the present invention, before or after supply of the power voltage applied to the light-emitting element 106 (specifically, the power voltage applied between the wiring 109 and the wiring 110) to the pixel 101 is cut, the potential of the gate electrode of the transistor 107 is initialized by input of the signal Sig2 containing no image data to the pixel 101.

Figure 2D:
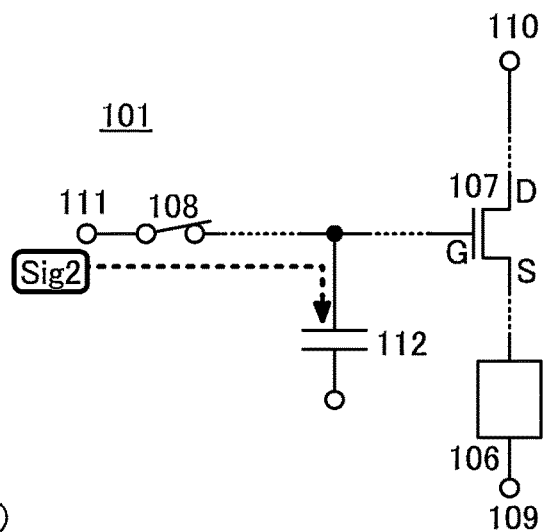

FIG. 2D schematically shows operation of the pixel 101 in the case where the signal Sig2 containing no image data is input to the pixel 101. In FIG. 2D, the potential of the signal Sig2 is applied to the gate electrode of the transistor 107 from the wiring 111 through the transistor 108 being ON. In the case where the transistor 107 is n-channel type, the potential of the signal Sig2 has a level such that the gate voltage of the transistor 107 is equal to or lower than the threshold voltage. In the case where the transistor 107 is p-channel type, the potential of the signal Sig2 has a level such that the gate voltage of the transistor 107 is equal to or higher than the threshold voltage.

Accordingly, in the case where the charges are accumulated in the capacitor 112 according to the potential of the signal Sig1, the charges are released by input of the potential of the signal Sig2 to the pixel 101. Thus, the transistor 107 is turned off and the light-emitting element 106 does not emit light regardless of whether or not the power voltage is applied between the wiring 109 and the wiring 110.

Although FIG. 1B illustrates the example where the transistor 107 and the transistor 108 each have a single-gate structure, each of the transistors may have a multi-gate structure in which a plurality of electrically connected gate electrodes are included so that a plurality of channel formation regions are included.

Figure 3A:
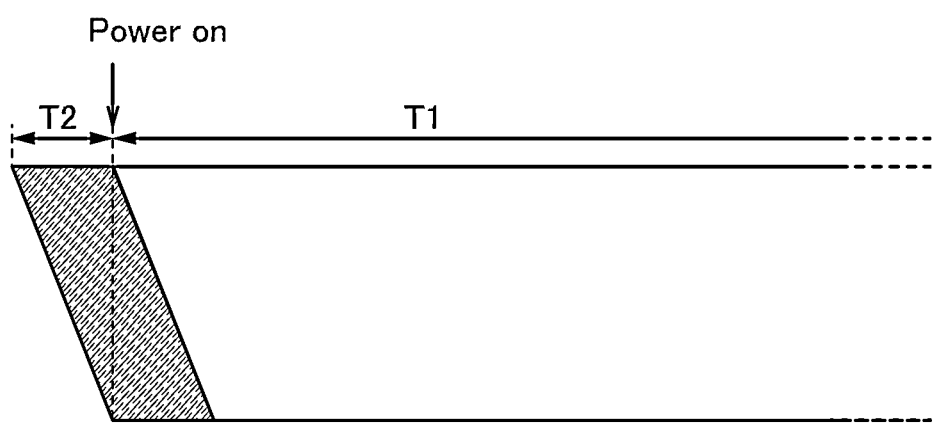
FIGS. 3A and 3B schematically illustrate operation of a pixel portion.
Figure 3B:
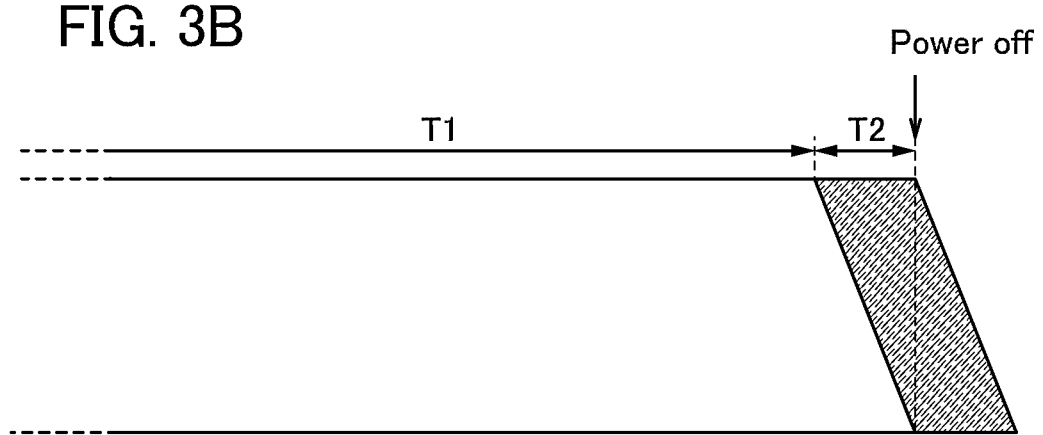

Next, examples of timings of cutting and providing again the supply of the power voltage to the pixel portion 102 in the light-emitting device 100 shown in FIG. 1A are described with reference to FIGS. 3A and 3B. FIGS. 3A and 3B schematically show operation of the pixel portion 102. The horizontal direction indicates time and the vertical direction indicates the position of one of the pixels 101 selected row by row in the pixel portion 102.

A period T2 is provided in FIG. 3A. In the period T2, the signal Sig2 is input to the plurality of pixels 101 included in the pixel portion 102 row by row before the supply of the power voltage to the pixel portion 102 is provided, and the potential of the gate electrode of the transistor 107 can be initialized in the plurality of pixels 101.

After the period T2, supply of the power voltage to the pixel portion 102 is provided. In one embodiment of the present invention, since the potential of the gate electrode of the transistor 107 is initialized in the period T2, an after-image is not appeared in the pixel portion 102 even after supply of the power voltage to the pixel portion 102 is provided again.

A period T1 is provided in FIG. 3A. In the period T1, the signal Sig1 is input to the plurality of pixels 101 included in the pixel portion 102 row by row, and is held. In the period T1, the gate voltage of the transistor 107 is determined according to the potential of the signal Sig1 containing image data and thus a value of current supplied to the light-emitting element 106 is also determined according to the potential of the signal Sig1. As a result, an image is displayed in the pixel portion 102 in the period T1.

In FIG. 3B, the period T1 and the period T2 are sequentially provided. In the period T1, the signal Sig1 is input to the plurality of pixels 101 included in the pixel portion 102 row by row and is held. In the period T2, the signal Sig2 is input to the plurality of pixels 101 included in the pixel portion 102 row by row before supply of the power voltage to the pixel portion 102 is cut, and the potential of the gate electrode of the transistor 107 can be initialized in the plurality of pixels 101.

In one embodiment of the present invention, since the potential of the gate electrode of the transistor 107 is initialized in the period T2, an after-image is not appeared in the pixel portion 102 even after supply of the power voltage to the pixel portion 102 is provided again.

Embodiment 2

In this embodiment, a structure example of the light-emitting device 100 illustrated in FIG. 1A is described in detail.

Figure 4:
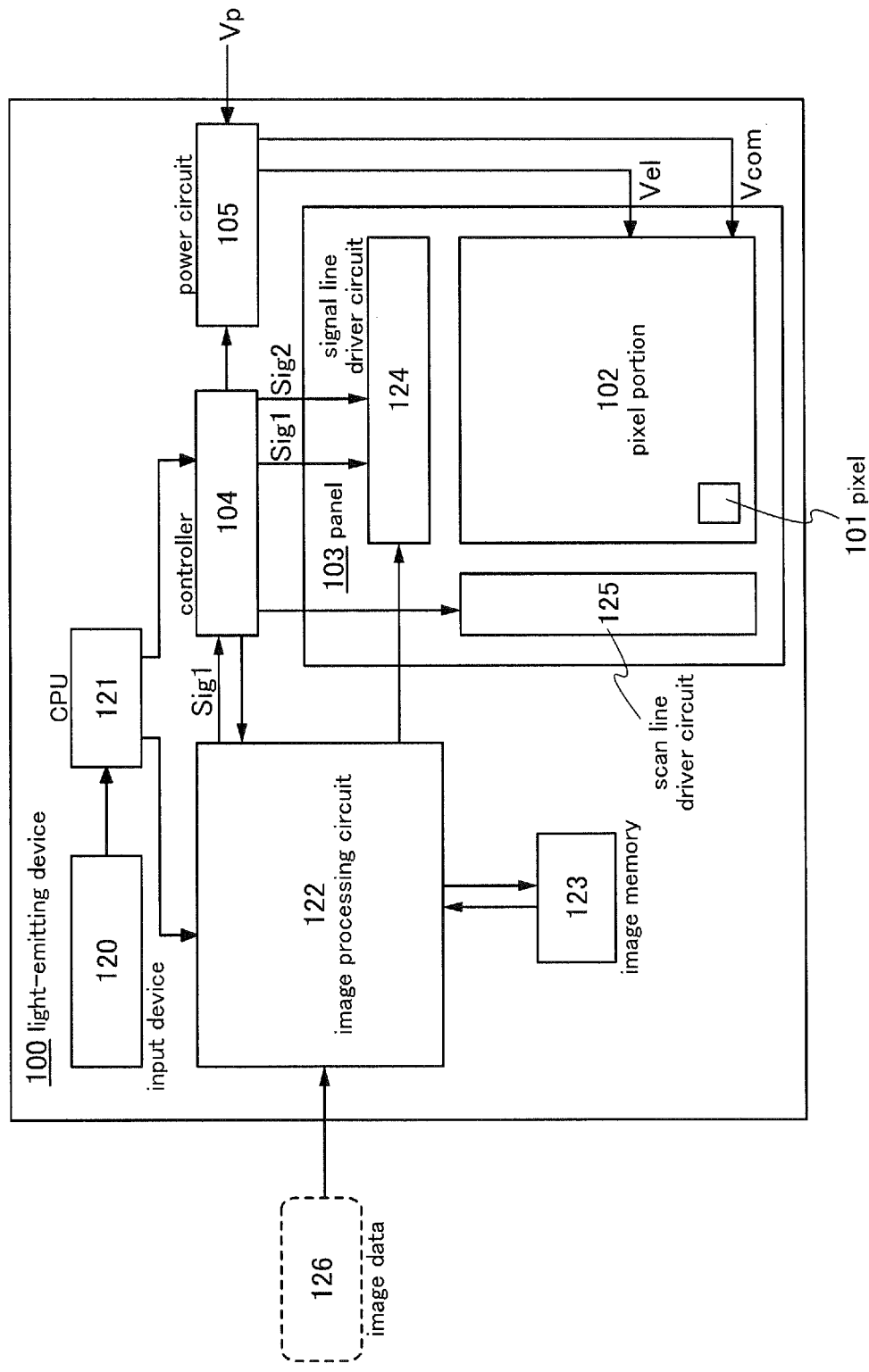
FIG. 4 illustrates the structure of a light-emitting device.

FIG. 4 is a block diagram illustrating a structure example of a light-emitting device according to one embodiment of the present invention. The light-emitting device 100 in FIG. 4 includes, as in FIG. 1A, the panel 103 having the plurality of pixels 101 in the pixel portion 102, the controller 104, and the power supply circuit 105. The light-emitting device 100 in FIG. 4 further includes an input device 120, a CPU 121, an image processing circuit 122, and an image memory 123. The panel 103 of the light-emitting device 100 in FIG. 4 includes a signal line driver circuit (a source driver) 124 and a scan line driver circuit (a gate driver) 125.

The input device 120 has a function of applying data or an instruction to the CPU 121 included in the light-emitting device 100. For example, the input device 120 can apply an instruction to transfer the pixel portion 102 from an operation state to a non-operation state and vice versa, to the CPU 121. As the input device 120, a keyboard, a pointing device, a touch panel, or the like can be used.

The CPU 121 has a function of decoding an instruction input from the input device 120 and executing the instruction by totally controlling operation of various circuits included in the light-emitting device 100.

For example, in the case where the instruction to transfer the pixel portion 102 from the operation state to the non-operation state is sent from the input device 120, the CPU 121 provides an instruction to the controller 104 to input the signal Sig2 to the panel 103. Further, the CPU 121 provides an instruction to the controller 104 to cut the supply of the power voltage from the power supply circuit 105 to the pixel portion 102.

In the case where an instruction to transfer the pixel portion 102 from the non-operation state to the operation state is sent from the input device 120, the CPU 121 provides the instruction to the controller 104 to input the signal Sig2 to the panel 103. Further, the CPU 121 provides the instruction to the controller 104 to provide the supply of the power voltage from the power supply circuit 105 to the pixel portion 102.

The image memory 123 has a function of storing an image data 126 input to the light-emitting device 100. Note that although just one image memory 123 is provided in the light-emitting device 100 in FIG. 4, a plurality of image memories 123 may be provided in the light-emitting device 100. For example, in the case where the pixel portion 102 displays a full-color image with the use of three pieces of image data 126 corresponding to hues such as red, blue, and green, the image memory 123 corresponding to each of the pieces of image data 126 may be provided.

As the image memories 123, for example, memory circuits such as dynamic random access memories (DRAMs) or static random access memories (SRAMs) can be used. Alternatively, as the image memories 123, video RAMs (VRAMs) may be used.

The image processing circuit 122 has a function of writing and reading the image data 126 to/from the image memory 123 in response to an instruction from the controller 104 and generating the signal Sig1 from the image data 126 which is read from the image memory 123.

The scan line driver circuit 125 has a function of selecting the plurality of pixels 101 included in the pixel portion 102 per row.

The signal line driver circuit 124 has a function of supplying the signal Sig1 or the signal Sig2 applied from the controller 104 to the pixels 101 in a row selected by the scan line driver circuit 125.

Note that the controller 104 has a function of supplying various driving signals used for driving the signal line driver circuit 124, the scan line driver circuit 125, and the like to the panel 103. The driving signal includes a signal line driver circuit start pulse signal SSP and a signal line driver circuit clock signal SCK for controlling operation of the signal line driver circuit 124, a latch signal LP, a scan line driver circuit start pulse GSP and a scan line driver circuit clock signal GCK for controlling operation of the scan line driver circuit 125, and the like.

This embodiment can be combined with any of the other embodiments as appropriate.

Embodiment 3

In this embodiment, an example of a specific structure of the pixel 101 included in the light-emitting device 100 illustrated in FIG. 1A is described.

Figure 5A:
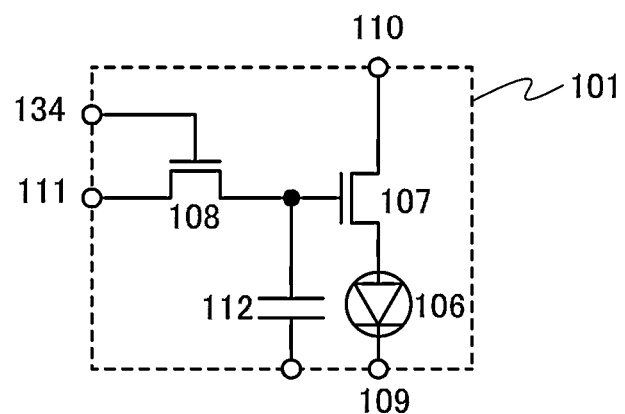
FIGS. 5A and 5B are circuit diagrams of a pixel.

FIG. 5A is an example of a circuit diagram of the pixel 101. The pixel 101 includes the transistor 108 controlling input of the signal Sig1 or the signal Sig2 to the pixel 101, the light-emitting element 106, the transistor 107 controlling the value of current supplied to the light-emitting element 106 in response to the signal Sig1 or the signal Sig2, and the capacitor 112 for holding the potential of the signal Sig1 or the signal Sig2.

Examples of the light-emitting element 106 include an element of which luminance is controlled by current or voltage. For example, in the case where OLED or the like is used as the light-emitting element 106, one of the anode and the cathode serves as a pixel electrode and the other thereof serves as a counter electrode.

The potential of the pixel electrode of the light-emitting element 106 is controlled according to the signal Sig1 or the signal Sig2 input to the pixel 101. The luminance of the light-emitting element 106 depends on a potential difference between the pixel electrode and the counter electrode. In each of the plurality of pixels 101 included in the pixel portion 102, the luminance of the light-emitting element 106 is controlled in accordance with the signal Sig1 containing image data, whereby displaying an image in the pixel portion 102.

Next, connection between the transistor 108, the transistor 107, the capacitor 112, and the light-emitting element 106 which are included in the pixel 101 is described.

One of the source terminal and the drain terminal of the transistor 108 is connected to the wiring 111, and the other thereof is connected to the gate electrode of the transistor 107. The gate electrode of the transistor 108 is connected to a wiring 134. One of the source terminal and the drain terminal of the transistor 107 is connected to the wiring 110, and the other thereof is connected to the light-emitting element 106. Specifically, the other of the source terminal and the drain terminal of the transistor 107 is connected to the pixel electrode of the light-emitting element 106. The counter electrode of the light-emitting element 106 is connected to the wiring 109.

When an oxide semiconductor is included in a channel formation region in the transistor 108, the transistor 108 with an extremely small off-state current can be obtained. Further, when the transistor 108 having the above-described structure is used for the pixel 101, leakage of electric charge accumulated in the gate electrode of the transistor 107 can be prevented more effectively than the case of using a transistor including a normal semiconductor material such as silicon or germanium.

Figure 5B:
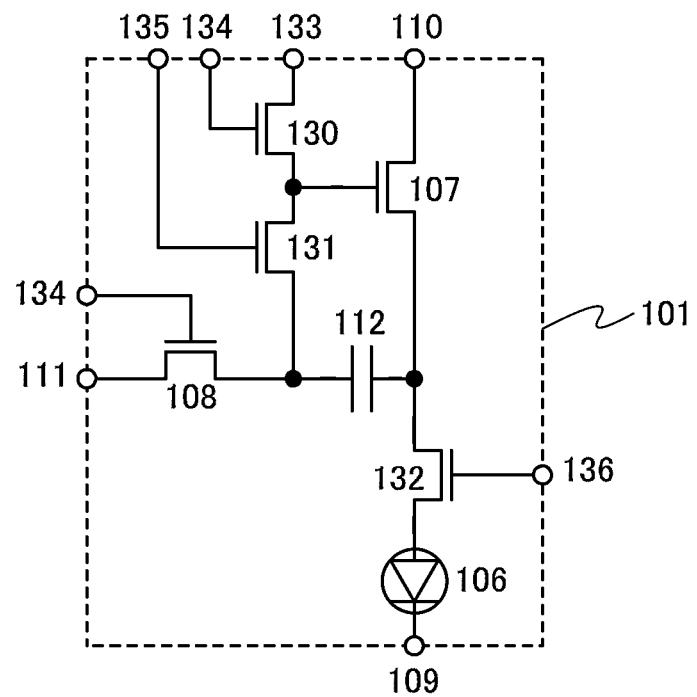

FIG. 5B is another example of the pixel 101.

FIG. 5B is an example of a circuit diagram of the pixel 101. The pixel 101 includes the transistor 107, the transistor 108, transistors 130 to 132, the light-emitting element 106, and the capacitor 112.

The transistor 108 has a function of controlling connection between the wiring 111 and one of the pair of electrodes of the capacitor 112. The other of the pair of electrodes of the capacitor 112 is connected to one of a source terminal and a drain terminal of the transistor 107. The transistor 130 has a function of controlling connection between a wiring 133 and the gate electrode of the transistor 107. The transistor 131 has a function of controlling connection between the one of the pair of electrodes of the capacitor 112 and the gate electrode of the transistor 107. The transistor 132 has a function of controlling connection between the one of the source terminal and the drain terminal of the transistor 107 and the anode of the light-emitting element 106.

In addition, in FIG. 5B, the other of the source terminal and the drain terminal of the transistor 107 is connected to the wiring 110.

The on/off state of the transistor 108 is determined by the potential of the wiring 134 connected to the gate electrode of the transistor 108. The on/off state of the transistor 130 is determined by the potential of the wiring 134 connected to a gate electrode of the transistor 130. The on/off state of the transistor 131 is determined by the potential of a wiring 135 connected to a gate electrode of the transistor 131. The on/off state of the transistor 132 is determined by the potential of a wiring 136 connected to a gate electrode of the transistor 132.

When an oxide semiconductor is included in channel formation regions in the transistor 108, the transistor 130, and the transistor 131, the transistors 108, 130, and 131 with an extremely small amount of off-state current can be obtained. Further, when the transistors 108, 130, and 131 having the above-described structure are used in the pixel 101, leakage of electric charge accumulated in the gate electrode of the transistor 107 can be prevented more effectively compared to the case of using a transistor including a normal semiconductor such as silicon or germanium.

The transistor 108 with an extremely small off-state current is used in the pixel 101 shown in FIG. 5A, and the transistors 108, 130, and 131 with an extremely small off-state current is used in the pixel 101 shown in FIG. 5B; accordingly, a period during which potential of the gate electrode of the transistor 107 is held can be longer. Accordingly, for example, in the case where the signal Sig1 containing the same image data are written to the pixel portion 102 for some consecutive frame periods, like a still image, display of an image can be maintained even when driving frequency is low, in other words, the number of writing cycles of the signal Sig2 for a certain period is reduced. For example, the transistor 108 in which a highly purified oxide semiconductor is used for an active layer is used, whereby an interval between writings of the signal Sig1 can be increased to 10 seconds or more, preferably 30 seconds or more, more preferably 1 minute or more. The longer the interval between writings of the signal Sig1 is made, the more power consumption can be reduced.

In addition, since the potential of the signal Sig1 can be held for a longer period, degradation of displayed image quality can be prevented even when the capacitor 112 for holding the potential of the signal Sig1 is not connected to the gate electrode of the transistor 107. Thus, it is possible to increase the aperture ratio by reducing the size of the capacitor 112 or without providing the capacitor 112. Accordingly, the light-emitting element 106 with long lifetime can be obtained, whereby the reliability of the light-emitting device 100 can be increased.

Note that the pixel 101 in FIGS. 5A and 5B may further have another circuit element such as a transistor, a diode, a resistor, a capacitor, or an inductor as needed.

The pixel 101 in FIG. 5A includes the capacitor 112; however, in the case where gate capacitance generated between a gate electrode and an active layer of the transistor 107 or parasitic capacitance of the gate electrode is high enough, i.e., the case where a potential of the signal Sig1 or the signal Sig2 can be sufficiently held by another capacitor, the capacitor 112 is not necessarily provided in the pixel 101.

In FIGS. 5A and 5B, the transistors each have the gate electrode on at least one side of a semiconductor film; alternatively, the transistors may each have a pair of gate electrodes sandwiching the semiconductor film. When one of the pair of gate electrodes is regarded as a back gate electrode, the back gate electrode may be floating or may be externally applied with a potential. In the latter case, potentials at the same level may be applied to the normal gate electrode and the back gate electrode, or a fixed potential such as a ground potential may be applied only to the back gate electrode. The level of the potential applied to the back gate electrode is controlled, whereby threshold voltage of the transistor can be controlled. By providing the back gate electrode, a channel formation region is enlarged and the drain current can be increased. Moreover, providing the back gate electrode facilitates formation of a depletion layer in the semiconductor film, which results in lower subthreshold swing (S value).

The transistors in FIGS. 5A and 5B are all n-channel transistors. When the transistors in the pixel 101 have the same channel type, it is possible to omit some of steps for fabricating the transistors, for example, a step of adding an impurity element imparting one conductivity type to the semiconductor film. Note that in the light-emitting device according to one embodiment of the present invention, not all the transistors in the pixel 101 are necessarily n-channel transistors. In the case where the cathode of the light-emitting element 106 is connected to the wiring 109, it is preferable that at least the transistor 107 be an n-channel transistor. In the case where the anode of the light-emitting element 106 is connected to the wiring 109, it is preferable that at least the transistor 107 is a p-channel transistor.

In the case where the transistor 107 is operated in a saturation region, its channel length or channel width is preferably larger than transistors other than the transistor 107 in the pixel 101. When the channel length is increased, characteristics in a saturation region have a flat slope; accordingly, a kink effect can be reduced. Alternatively, the increase in the channel length allows a large amount of current to flow through the transistor 107 even in the saturation region.

FIGS. 5A and 5B each illustrate that the transistors in the pixel 101 have a single-gate structure including one gate electrode and one channel formation region; however, the transistor in the present invention is not limited to the single-gate transistor. Any or all of the transistors in the pixel 101 may have a multi-gate structure including a plurality of gate electrodes electrically connected to each other and a plurality of channel formation regions.

Figure 6:
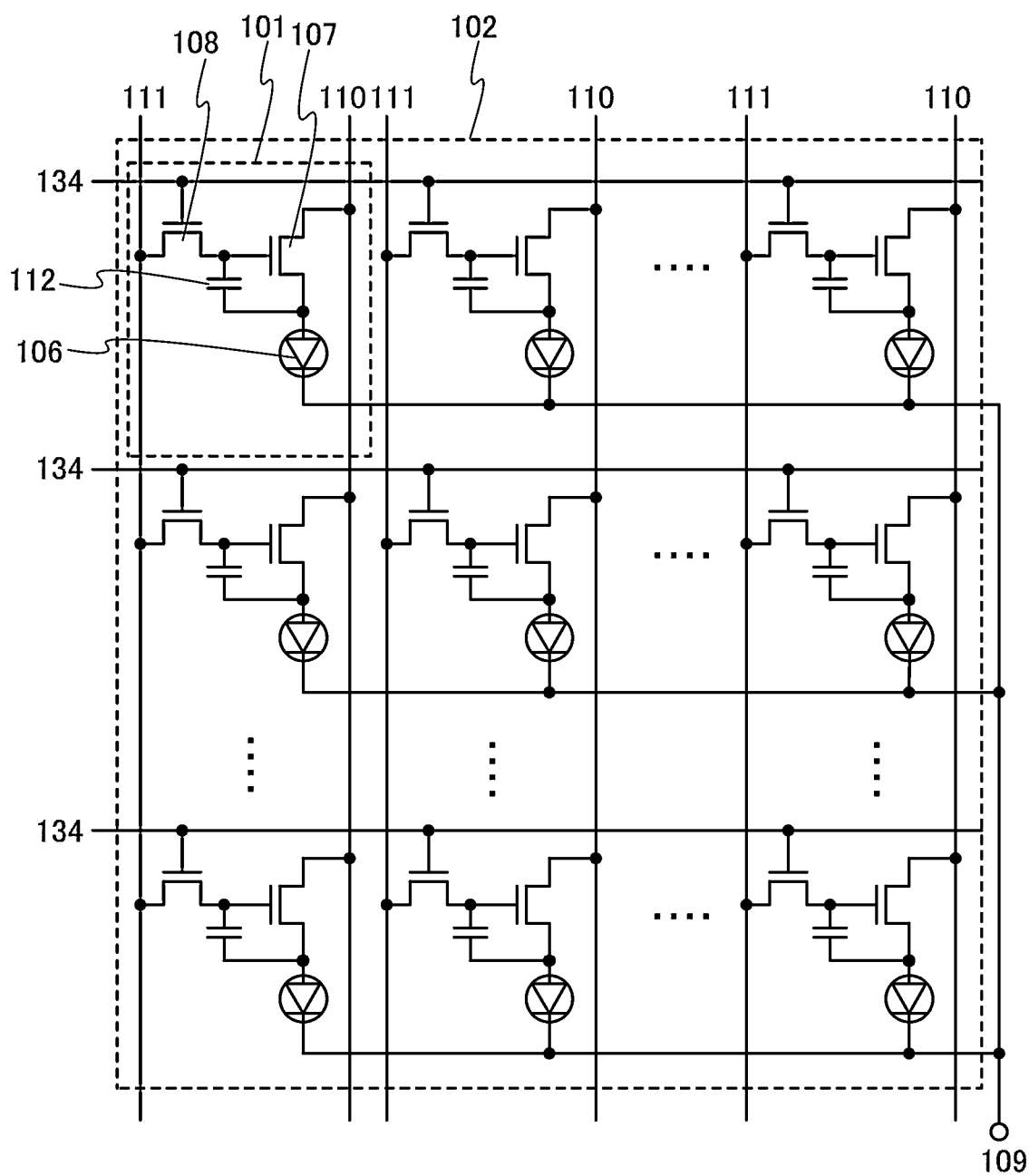
FIG. 6 illustrates a configuration of a pixel portion.

Next, a structure example of the pixel portion 102 is described, giving the example of the pixel 101 shown in FIG. 5A. FIG. 6 is an example of a specific circuit diagram of the pixel portion 102.

As shown in FIG. 6, the pixel portion 102 includes a plurality of wirings 111, a plurality of wirings 134, a plurality of wirings 110, and the wiring 109. For example, in the case of the light-emitting device 100 shown in FIG. 4, the plurality of wirings 111 is connected to the signal line driver circuit 124, the plurality of wirings 134 is connected the scan line driver circuit 125, and the plurality of wirings 110 and the wiring 109 are connected to the power supply circuit 105.

Each pixel 101 is connected to one of the plurality of wirings 111, one of the plurality of wirings 134, and one of the plurality of wirings 110. All the pixels 101 are connected to the wiring 109.

In the pixel portion 102 shown in FIG. 6, the plurality of wirings 134 is selected sequentially when the signal Sig1 or the signal Sig2 is input to the pixel 101. In each of the pixels 101 connected to the selected wiring 134, the transistor 108 whose gate electrode is connected to the wiring 134 is turned on. The transistor 108 is turned on, whereby the potential of the signal Sig1 or the signal Sig2 input to each of the plurality of wirings 111 is applied to the gate electrode of the transistor 107. When the selection of the wirings 134 is completed, the transistor 108 is turned off and the potential of the signal Sig1 or the signal Sig2 is held in the gate electrode of the transistor 107.

In the case where the signal Sig1 containing image data is input to the pixel 101, a light-emitting state of the light-emitting element 106 is determined according to the potential of the signal Sig1. Specifically, when the transistor 107 is turned on in response to the potential of the signal Sig1, the light-emitting element 106 is supplied with current and then is in the light-emitting state. When the transistor 107 is turned off in response to the potential of the signal Sig1 or the signal Sig2, the light-emitting element 106 is not supplied with current and is in the non-light-emitting state.

Through the above-described operation, the pixel portion 102 can display an image.

Figure 11A:
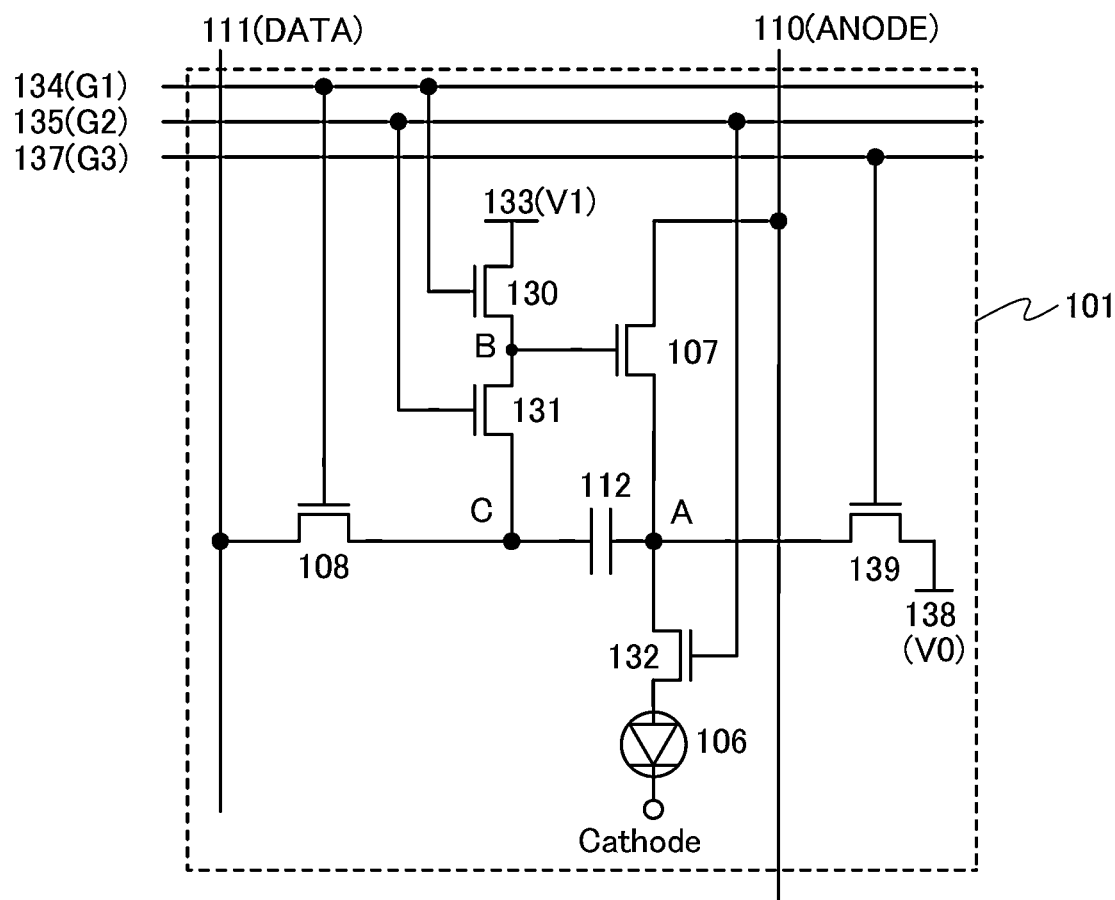
FIGS. 11A and 11B are a circuit diagram and a timing chart of a pixel.

Note that the pixel 101 may have a structure shown in FIG. 11A. The pixel 101 shown in FIG. 11A has a structure in which a transistor 139 is added to the pixel 101 shown in FIG. 5B. One of a source terminal and a drain terminal of the transistor 139 is connected to the other of the pair of electrodes of the capacitor 112, the one of the source terminal and the drain terminal of the transistor 107, and one of a source terminal and a drain terminal of the transistor 132. The other of the source terminal and the drain terminal of the transistor 139 is connected to a wiring 138. A gate electrode of the transistor 139 is connected to the wiring 137. Note that FIG. 5B is an example in which the gate electrode of the transistor 132 is connected to the wiring 136, whereas FIG. 11A is an example in which the gate electrode of the transistor 132 is connected to the wiring 135.

Figure 11B:
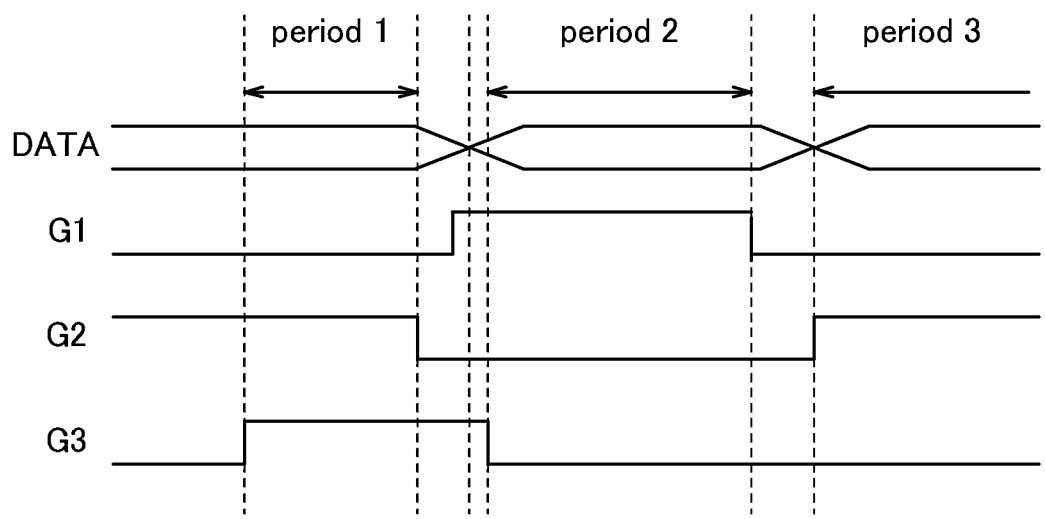

FIG. 11B is a timing chart of potentials supplied to the wiring 134 (G1), the wiring 135 (G2), and the wiring 137 (G3), which are connected to the pixel 101 shown in FIG. 11A, and a potential supplied to the wiring 111 (DATA). Note that the timing chart shown in FIG. 11B is an example in which the transistors included in the pixel 101 shown in FIG. 11A are n-channel transistors.

First, in a period 1, a low-level potential is applied to the wiring G1, a high-level potential is applied to the wiring G2, and a high-level potential is applied to the wiring G3. Thus, the transistors 131, 132, and 139 are turned on and the other transistors are turned off. The transistors 132 and 139 are turned on, whereby a potential V0, which is the potential of the wiring 138, is applied to the one of the source terminal and the drain terminal of the transistor 107 and the other electrode of the capacitor 112 (represented as a node A). Then, the wiring G2 is switched to low level, whereby the transistors 131 and 132 are turned off and the node A is held at the potential V0.

A potential Vano is applied to the wiring 110 (ANODE), and a potential Vcat is applied to the cathode of the light-emitting element 106. The potential Vano is preferably higher than the sum of the potential V0 and the threshold voltage Vthe of the light-emitting element 106.

Next, a period 2 is described. In the period 2, a high-level potential is applied to the wiring G1, a low-level potential is applied to the wiring G2, and a low-level potential is applied to the wiring G3. Accordingly, the transistors 108 and 130 are turned on and the transistors 131, 132, and 139 are turned off.

During transition from the period 1 to the period 2, the potential applied to the wiring G3 is preferably switched from high level to low level after the potential applied to the wiring G1 is switched from low level to high level, whereby preventing change of the potential of the node A due to switching of the potential applied to the wiring G1.

The potential Vano is applied to the wiring 110 (ANODE), and the potential Vcat is applied to the cathode of the light-emitting element 106. Then, a potential Vdata of an image signal is applied to the wiring 111 (DATA) and the potential V1 is applied to the wiring 133. Note that the potential V1 is preferably higher than the sum of the potential V0 and the threshold voltage Vth of the transistor 107 and lower than the sum of the potential Vano and the threshold voltage Vth of the transistor 107.

Note that in the pixel structure shown in FIG. 11A, even if the potential V1 is higher than the sum of the potential Vcat and the threshold voltage Vthe of the light-emitting element, the light-emitting element 106 does not emit light as long as the transistor 132 is OFF. Thus, the allowable potential V0 range can be expanded and the allowable range of V1-V0 can also be increased. As a result of increasing the degree of freedom of values for V1-V0, threshold voltage of a transistor can be accurately obtained even when time required to obtain the threshold voltage of the transistor is reduced or is limited.

By the above operation, the potential V1 higher than the threshold voltage of the transistor 107 is input to the gate electrode (illustrated as a node B) of the transistor 107, whereby turning the transistor 107 on. Thus, charge in the capacitor 112 is discharged through the transistor 107, and the potential of the node A, which is the potential V0, starts to rise. When the potential of the node A finally reaches the potential V1-Vth, that is, when the gate voltage of the transistor 107 is decreased to the threshold voltage Vth of the transistor 107, the transistor 107 is turned off.

When the transistor 107 is turned off, the potential of the one of the source terminal and the drain terminal of the transistor 107 becomes a potential in which the threshold voltage of the transistor 107 is subtracted from the potential of the gate electrode of the transistor 107 (V1, here), that is, V1-Vth. The potential Vdata is applied to one electrode of the capacitor 112 (illustrated as a node C).

Next, a period 3 is described. In the period 3, current flows into the light-emitting element 106 so that the light-emitting element 106 emits light. In the period 3, a low-level potential is applied to the wiring G1, a high-level potential is applied to the wiring G2, and a low-level potential is applied to the wiring G3. Thus, the transistors 131 and 132 are turned on, and the transistors 107, 108, 130, and 139 are turned off.

During transition from the period 2 to the period 3, the potential applied to the wiring G2 is preferably switched from low level to high level after the potential applied to the wiring G1 is switched from high level to low level, whereby preventing change of the node A potential due to switching of the potential applied to the wiring G1.

The potential Vano is applied to the wiring 110 (ANODE), and the potential Vcat is applied to the cathode of the light-emitting element 106.

The potential Vdata is applied to the node B by the above operation; thus, the gate voltage of the transistor 107 becomes Vdata−V1+Vth. Accordingly, the gate voltage of the transistor 107 can have the value to which the threshold voltage Vth is added. With this structure, variation of the threshold voltages Vth of the transistor 107 can be reduced to about 20%. Further, it can respond to the change in the threshold voltage Vth due to deterioration of the transistor 107. Thus, variation of current values supplied to the light-emitting element 106 can be suppressed, whereby reducing unevenness in luminance of the light-emitting device.

Note that the potential applied to the wiring G2 is greatly varied here, whereby an influence of variation of threshold voltages of the transistor 132 on the value of a current supplied to the light-emitting element 106 can be prevented. In other words, the high-level potential applied to the wiring G2 is much higher than the threshold voltage of the transistor 132, and the low-level potential applied to the wiring G2 is much lower than the threshold voltage of the transistor 132; thus, on/off switching of the transistor 132 is secured and the influence of variation of threshold voltages of the transistor 132 on the value of current supplied to the light-emitting element 106 can be prevented.

Figure 12:
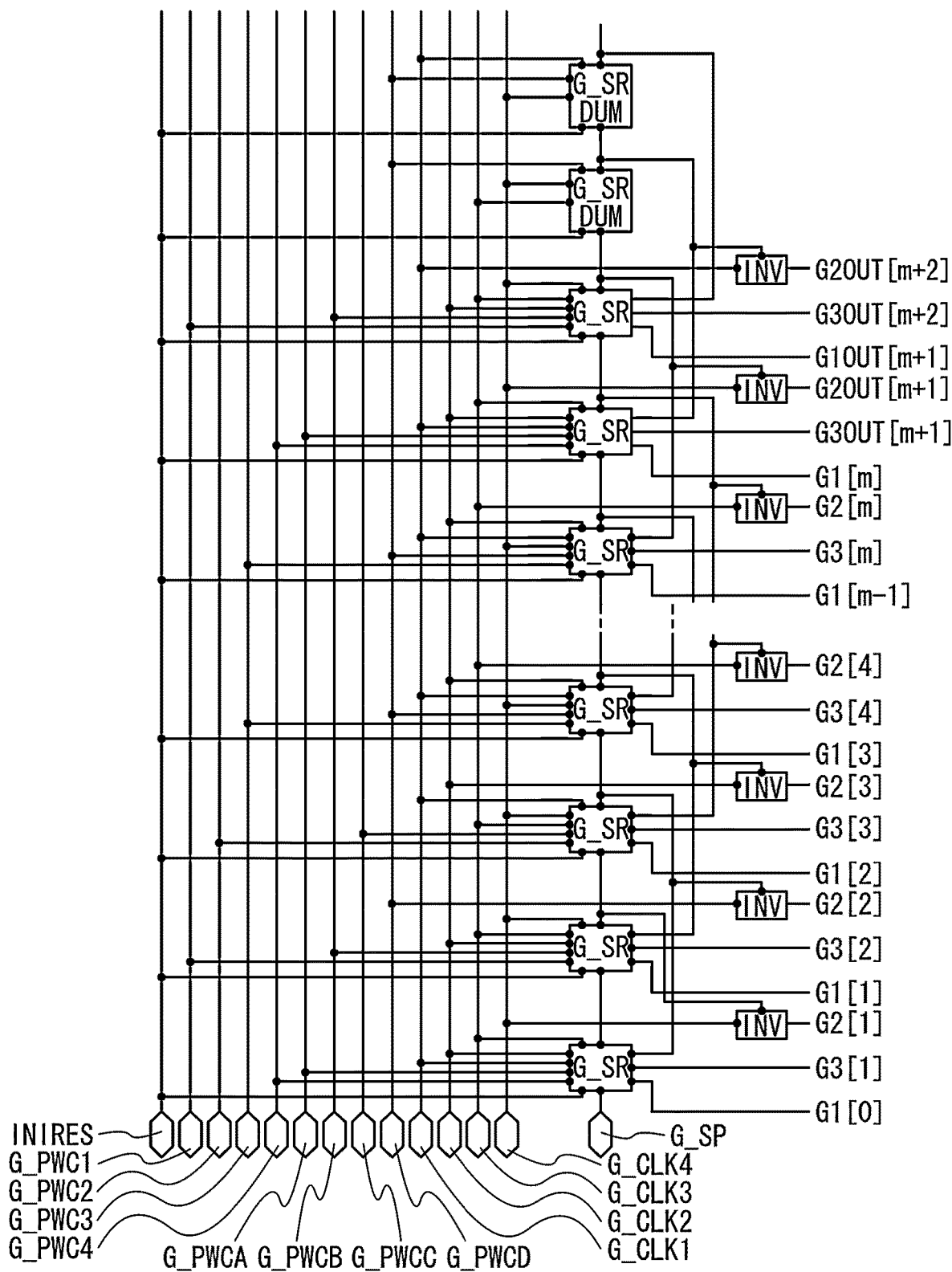
FIG. 12 illustrates a circuit diagram of a scan line driver circuit.
Figure 13A:
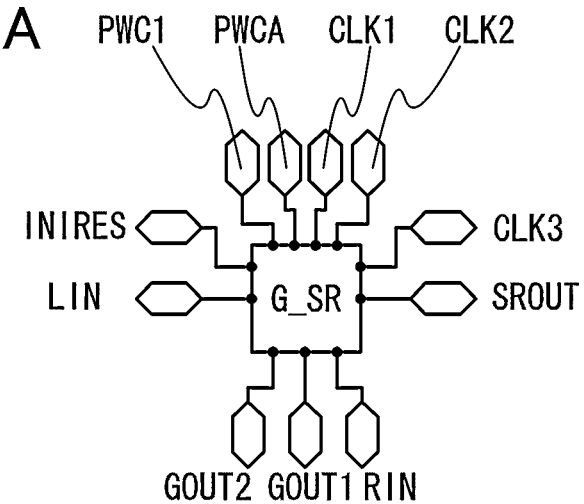
FIGS. 13A to 13C schematically illustrates components of a scan line driver circuit.
Figure 13B:
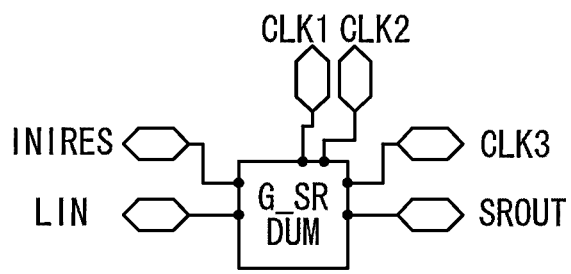
Figure 13C:
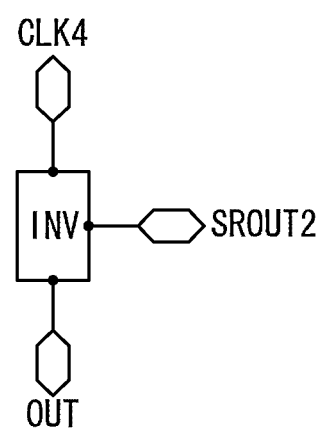

FIG. 12 is an example of a scan line driver circuit which can be operated using the pixel 101 shown in FIG. 11A and the timing chart shown in FIG. 11B. FIGS. 13A to 13C are schematic views respectively showing positions of terminals of a shift register, a shift register in a dummy stage, and an inverter, which are components of the scan line driver circuit.

Figure 15:
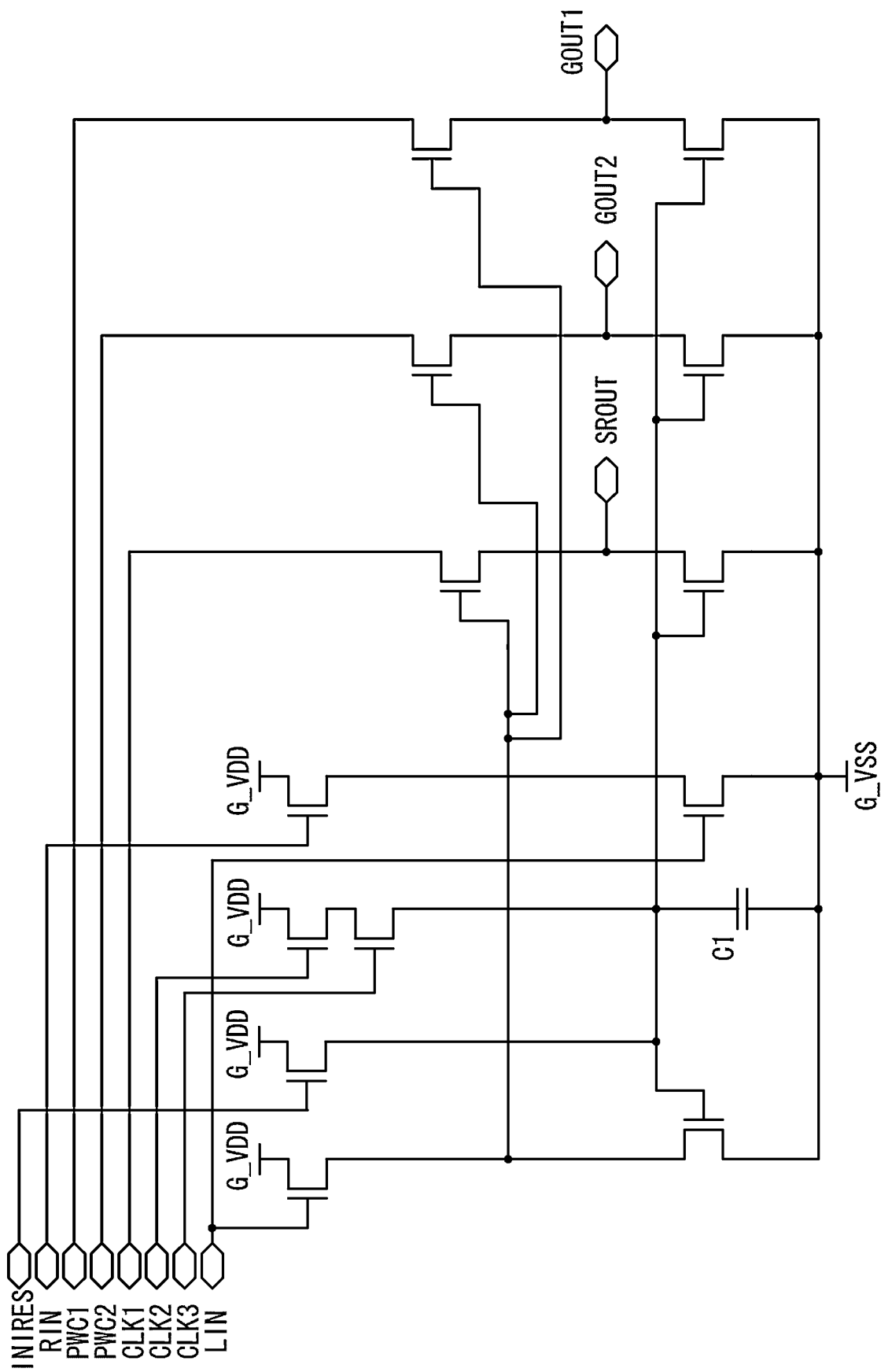
FIG. 15 is a circuit diagram of a shift register.
Figure 16:
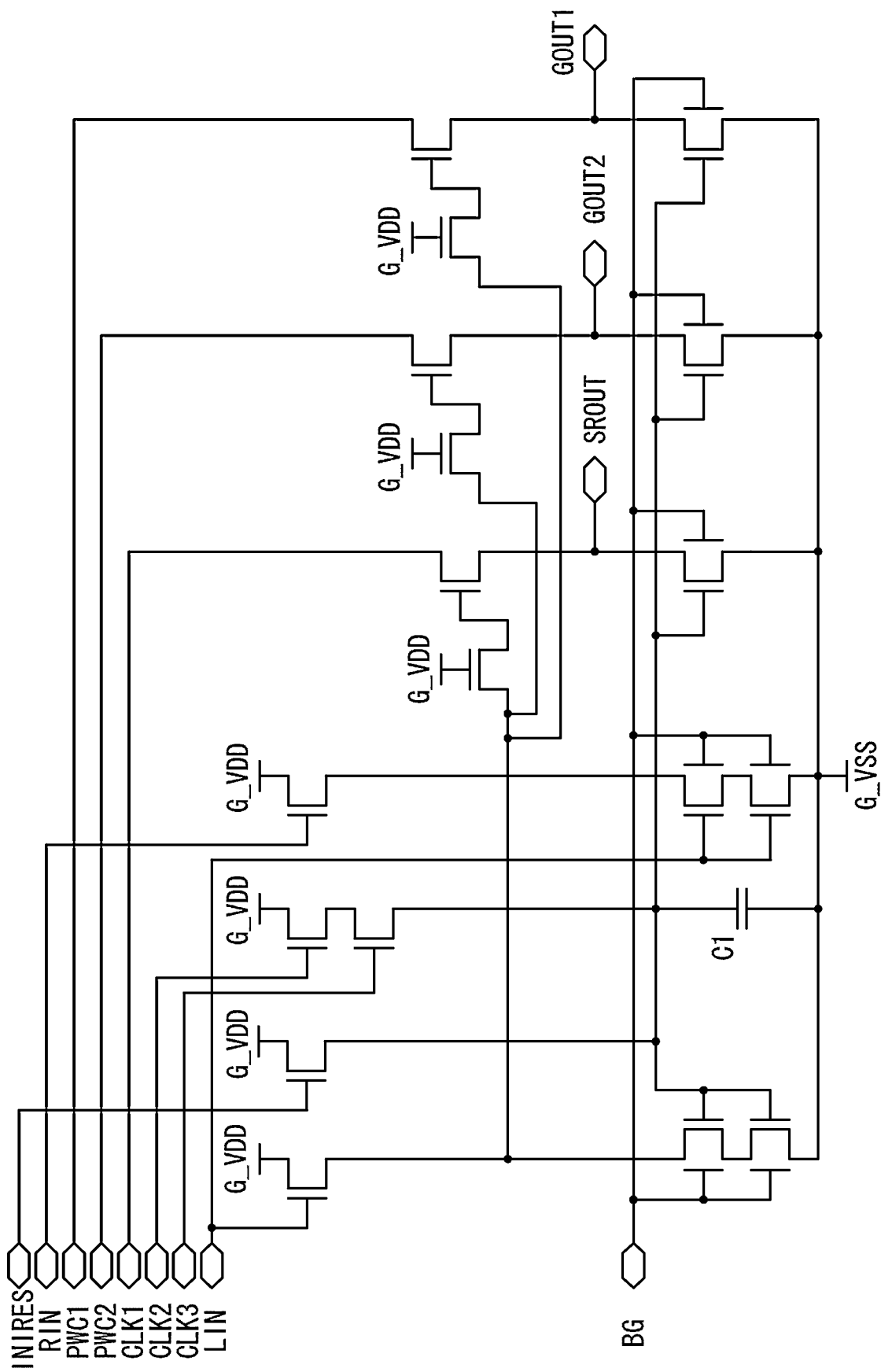
FIG. 16 is a circuit diagram of a shift register.
Figure 17:
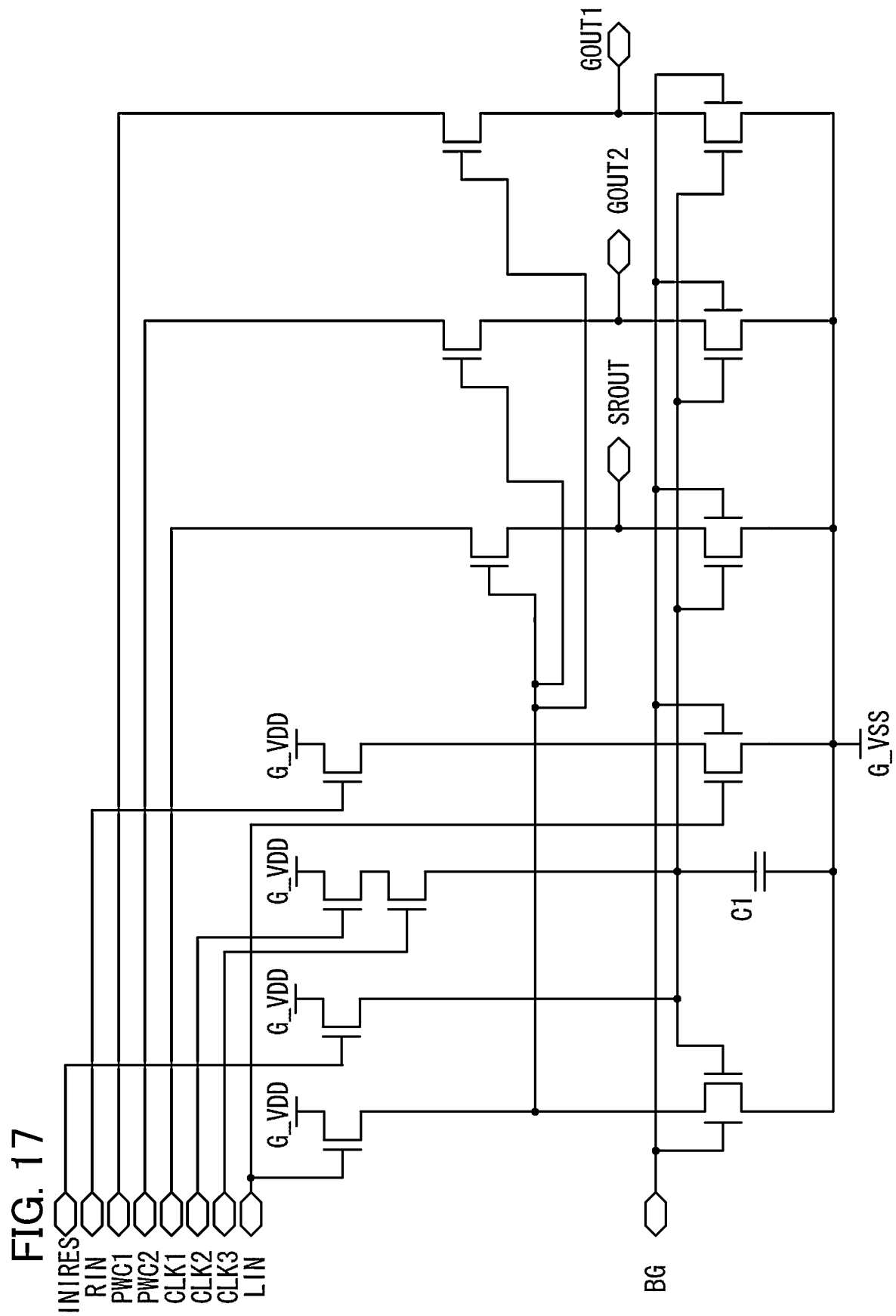
FIG. 17 is a circuit diagram of a shift register.

FIGS. 14 and 15 are diagrams of circuits which can be used as the shift register shown in FIG. 13A. In each of the circuits, a transistor may have a backgate electrode as shown in FIG. 16 and FIG. 17.

Figure 18:
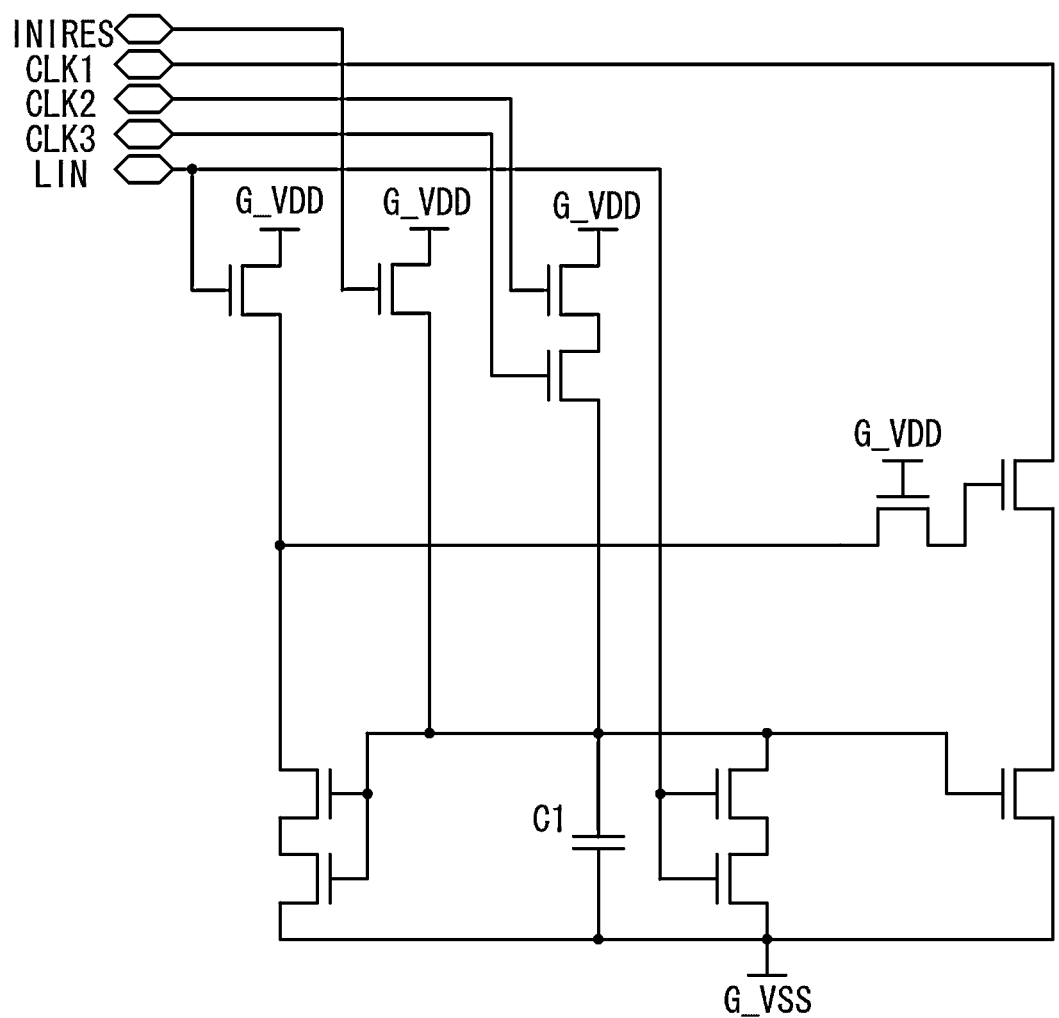
FIG. 18 is a circuit diagram of a shift register in a dummy stage.
Figure 19:
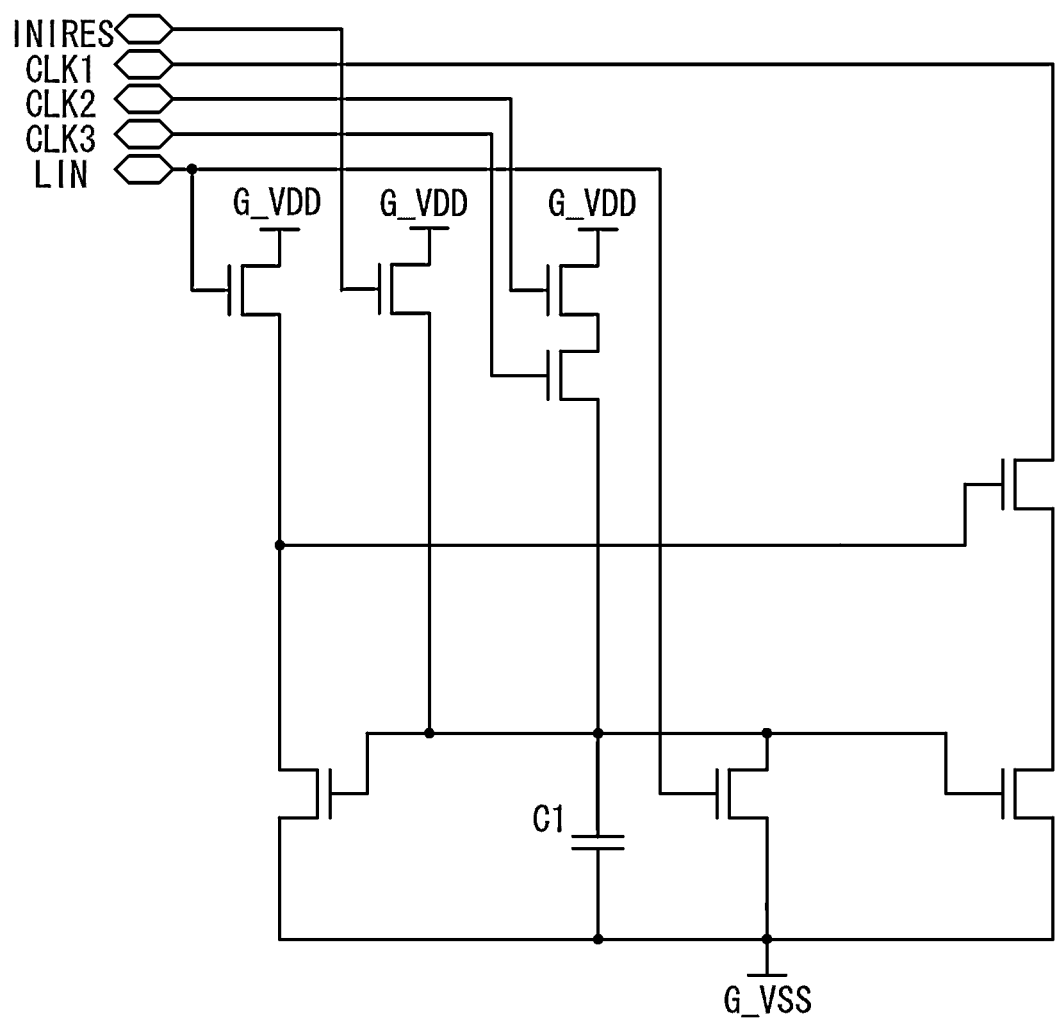
FIG. 19 is a circuit diagram of a shift register in a dummy stage.
Figure 20:
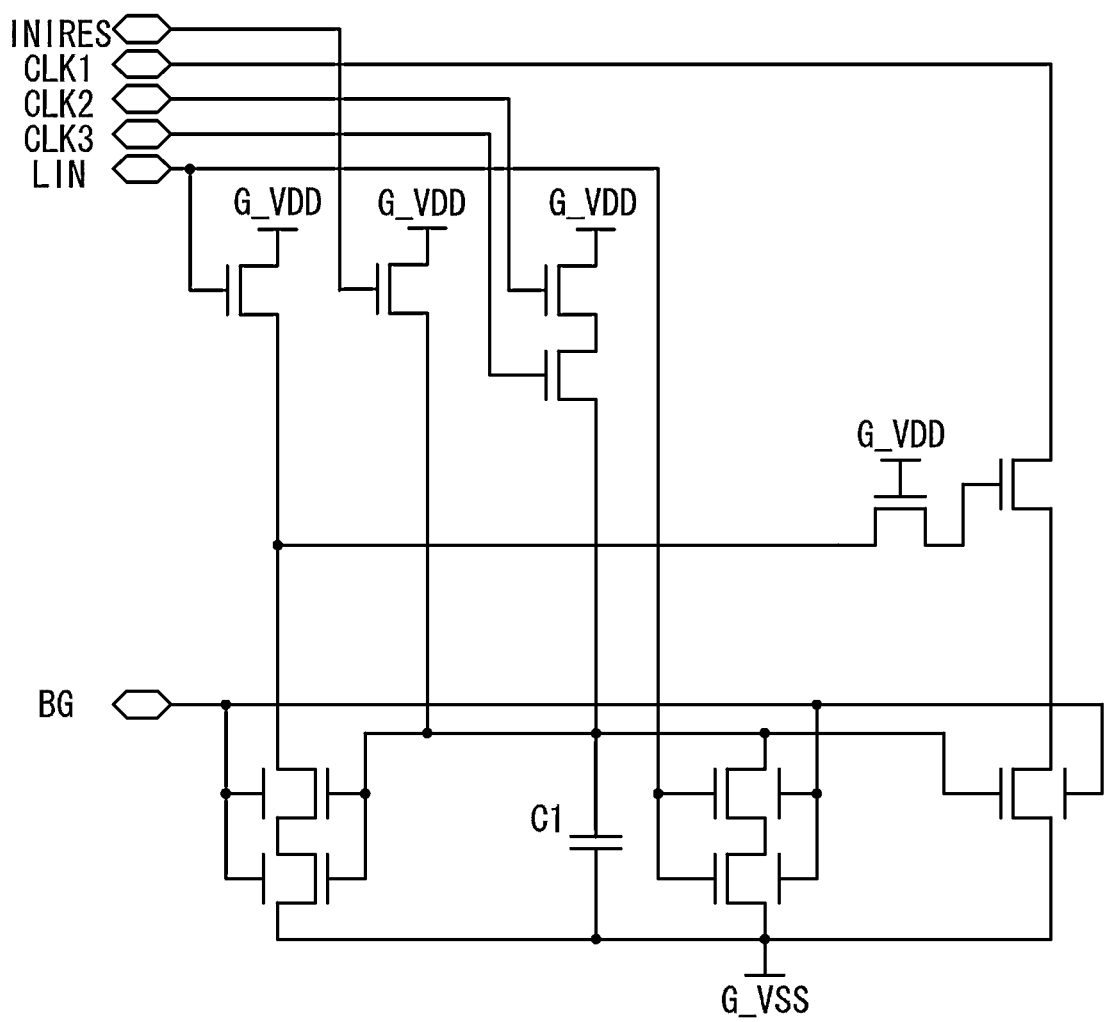
FIG. 20 is a circuit diagram of a shift register in a dummy stage.
Figure 21:
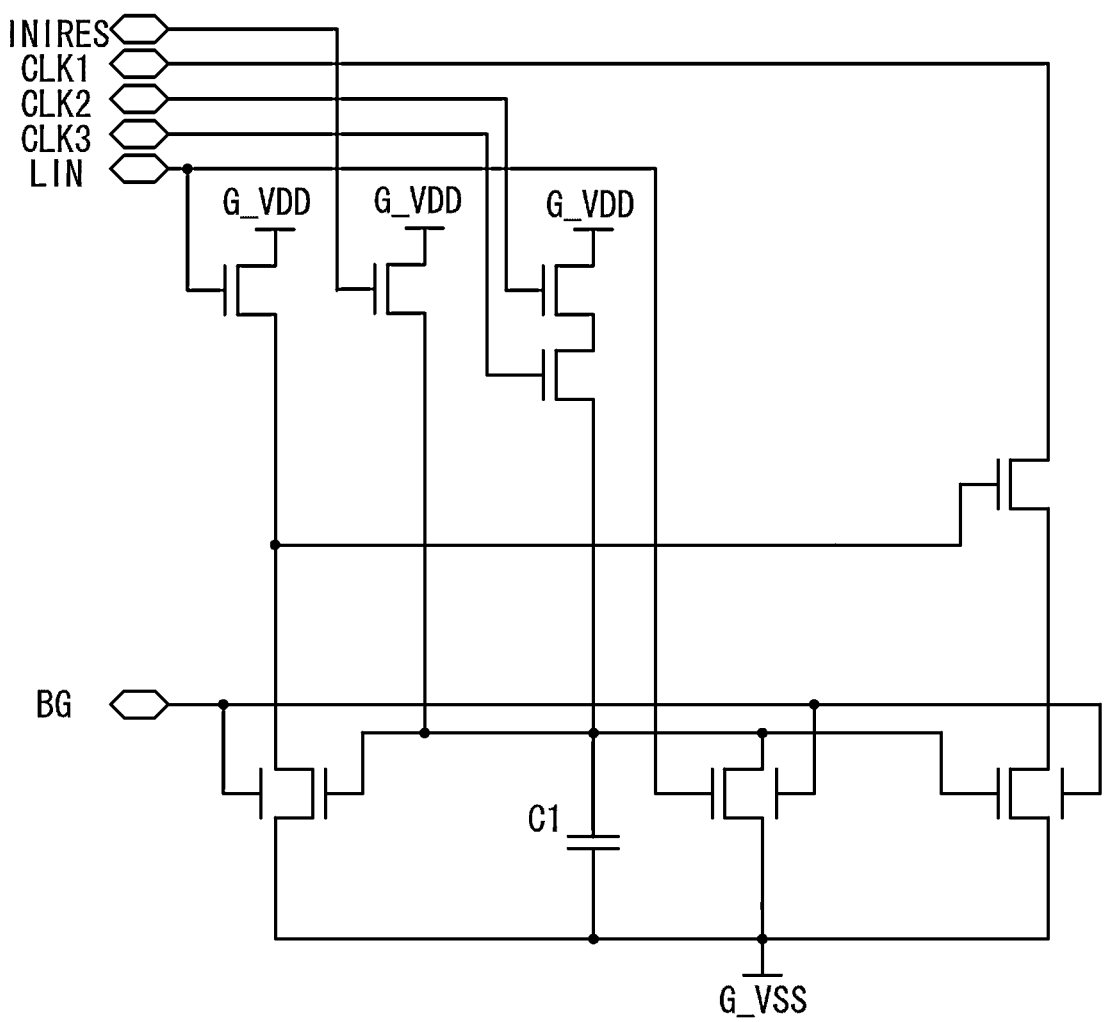
FIG. 21 is a circuit diagram of a shift register in a dummy stage.
Figure 22A:
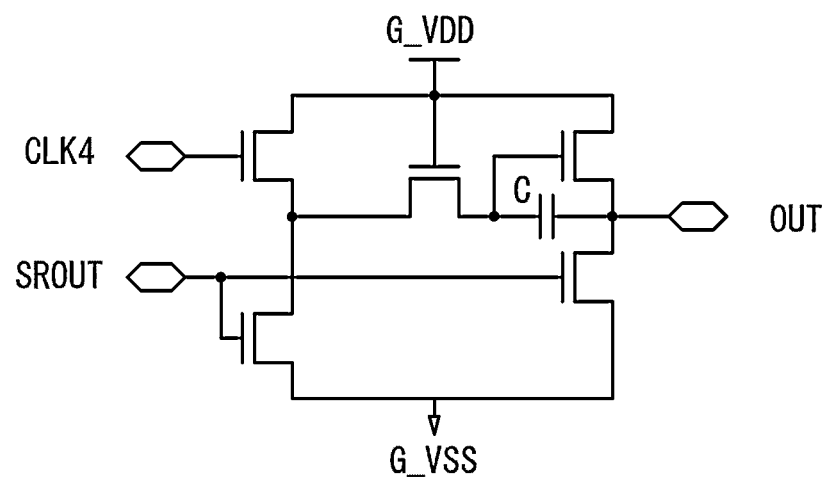
FIGS. 22A and 22B are circuit diagrams of an inverter.
Figure 22B:
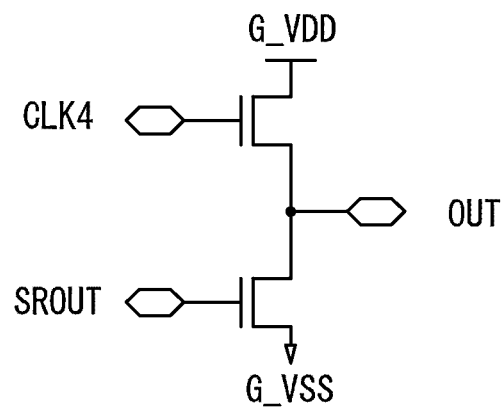

FIGS. 18 and 19 are diagrams of circuits which can be used as the shift register in a dummy stage. In each of the circuits, a transistor may have a backgate electrode as shown in FIG. 20 and FIG. 21. FIGS. 22A and 22B are circuit diagrams which can be used as inverters.

Figure 23:
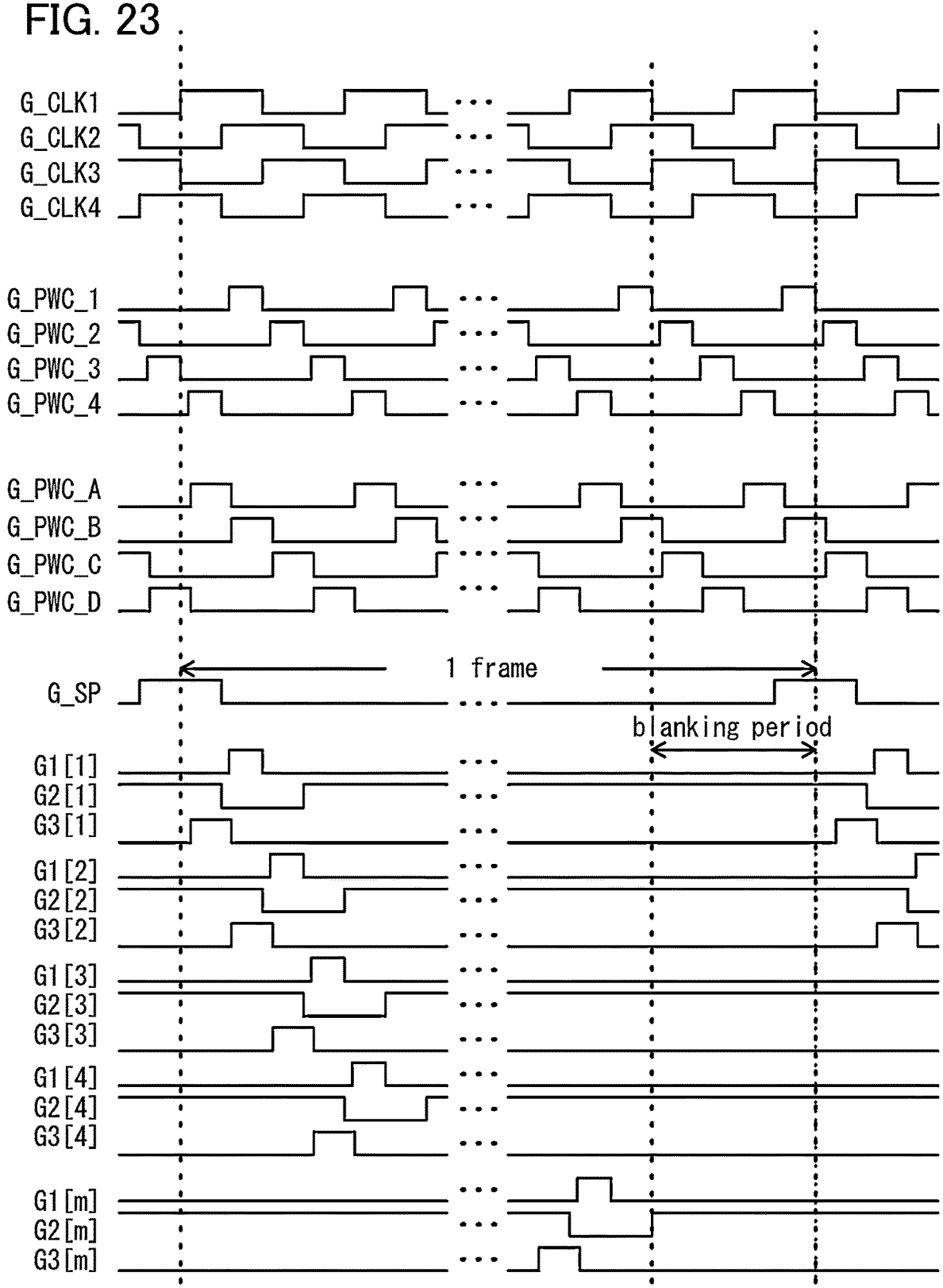
FIG. 23 is a timing chart.

The scan line driver circuit shown in FIG. 12 can be operated using the timing chart shown in FIG. 23.

Figure 24:
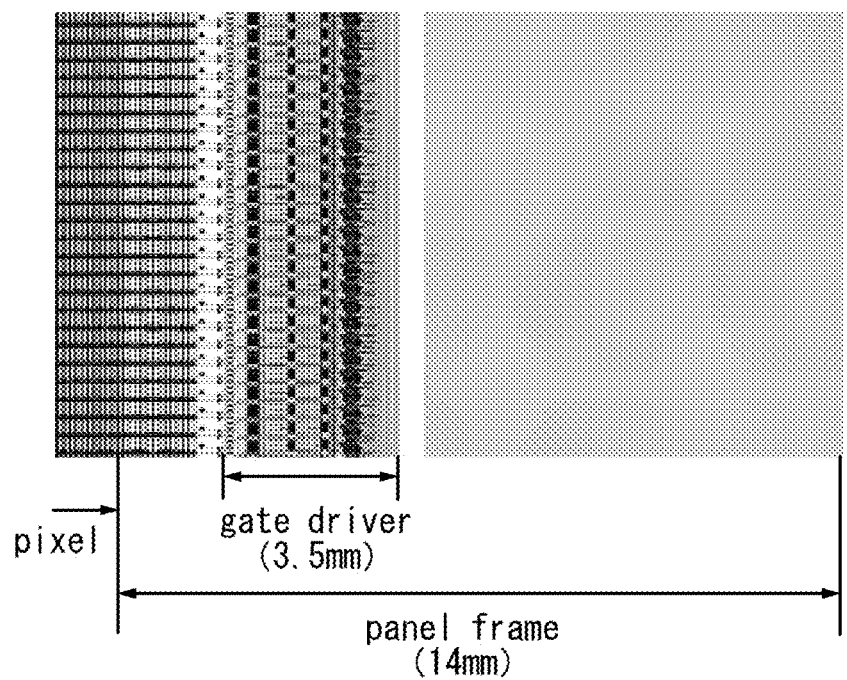
FIG. 24 is a photograph of a periphery of a panel frame.

FIG. 24 is a photograph of a periphery of a panel frame. The panel includes the pixel circuit shown in FIG. 11A and the scan line driver circuit (gate driver) shown in FIG. 12. The specification of the panel is shown in Table 1. The width of the scan line driver circuit is 3.5 mm, indicating that a panel with a thin frame can be manufactured using the scan line driver circuit described in this embodiment.

TABLE 1

| | Specifications |
|---|---|
| Screen size (diagonal) | 13.3 inch |
| Driving method | Active matrix |
| Resolution | 854 × RGB × 480 (WVGA) |
| Pixel pitch | 0.115 mm × RGB × 0.345 mm |
| Pixel density | 73 ppi |
| Aperture ratio | 45.1% |
| Pixel array | RGB-stripe |
| Frame width on gate side (both sides) | 12.6 mm (width of driver: 4.0 mm or less) |
| Frame width on source side (both sides) | 18.4 mm |
| Pixel circuit | 6Tr + 1C/cell |
| Source driver | COF |
| Gate driver | integrated |

Note that as one example of a semiconductor material which has a wider band gap than a silicon semiconductor and has a lower intrinsic carrier density than silicon, a compound semiconductor such as silicon carbide (SiC) or gallium nitride (GaN) can be given in addition to an oxide semiconductor. The oxide semiconductor has an advantage of high mass productivity because a transistor with favorable electrical characteristics can be formed by a sputtering method or a wet process, unlike silicon carbide or gallium nitride. Further, unlike silicon carbide or gallium nitride, the oxide semiconductor can be deposited even at room temperature; thus, a transistor with favorable electrical characteristics can be formed over a glass substrate or an integrated circuit using silicon. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the property of a transistor (e.g., field-effect mobility), the oxide semiconductor with crystallinity can be easily obtained by heat treatment at 250° C. to 800° C.

Note that a highly purified oxide semiconductor (purified OS) obtained by reduction of impurities such as moisture or hydrogen which serves as an electron donor (donor) and by reduction of oxygen vacancies is an i-type (intrinsic) semiconductor or a substantially i-type semiconductor. Therefore, a transistor including the oxide semiconductor has a characteristic of significantly small off-state current. Furthermore, the band gap of the oxide semiconductor is 2 eV or more, preferably 2.5 eV or more, more preferably 3 eV or more. With the use of the oxide semiconductor film which is highly purified by sufficiently reducing the concentration of impurities such as moisture or hydrogen and by reducing oxygen vacancies, off-state current of the transistor can be reduced.

Specifically, various experiments can prove small off-state current of a transistor including a highly purified oxide semiconductor film as a channel formation region. For example, even when an element has a channel width of $1\times10^6$ μm and a channel length of 10 μm, off-state current can be lower than or equal to the measurement limit of a semiconductor parameter analyzer, i.e., lower than or equal to $1\times10^{-13}$ A, at voltage (drain voltage) between the source electrode and the drain electrode of from 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film was used for a channel formation region of the transistor, and the off-state current of the transistor was measured from a change in the amount of electric charge of the capacitor per unit hour. As a result, it is found that, in the case where the voltage between the source electrode and the drain electrode of the transistor is 3 V, a smaller off-state current density of several tens of yA/μm is obtained. Accordingly, the off-state current of the transistor in which the highly purified oxide semiconductor film is used as a channel formation region is considerably lower than that of a transistor in which silicon having crystallinity is used.

Note that an oxide semiconductor preferably contains at least indium (In) or zinc (Zn). In particular, In and Zn are preferably contained. As a stabilizer for reducing variation in electrical characteristics of a transistor including the oxide semiconductor, gallium (Ga) is preferably additionally included. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—

Zn-based oxide, an In—Sn—Al—Zn-based oxide, an In—Sn—Hf—Zn-based oxide, or an In—Hf—Al—Zn-based oxide can be used.

In this specification, an In—Ga—Zn-based oxide means, for example, an oxide including In, Ga, and Zn, and there is no limitation on the ratio of In:Ga:Zn. Further, the In—Ga—Zn-based oxide may contain a metal element other than In, Ga, and Zn. The In—Ga—Zn-based oxide has sufficiently high resistance when there is no electric field; thus, off-state current can be sufficiently reduced. In addition, also having high field-effect mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition can be used in accordance with necessary electrical characteristics (such as mobility, threshold voltage, and variation). In order to obtain the necessary electrical characteristics, the carrier density, the impurity concentration, the defect density, the atomic ratio between a metal element and oxygen, the interatomic distance, the density, and the like are preferably set to appropriate values.

For example, the oxide semiconductor film can be formed by a sputtering method using a target including indium (In), gallium (Ga), and zinc (Zn). In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the above atomic ratio, a polycrystal or a CAAC-OS to be described later is easily formed. The filling factor of the target including In, Ga, and Zn is 90% or higher and 100% or lower, and preferably 95% or higher and lower than 100%. With the use of the target with high filling rate, a dense oxide semiconductor film is formed.

In the case where an In—Zn-based oxide material is used as an oxide semiconductor, a target of the In—Zn-based oxide has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target used for formation of an oxide semiconductor film including an In—Zn-based oxide which has an atomic ratio of In:Zn:O=X:Y:Z, the relation of Z>1.5X+Y is satisfied. The mobility can be improved by keeping the ratio of Zn within the above range.

In the case of forming a film of an In—Sn—Zn-based oxide semiconductor film as an oxide semiconductor film by a sputtering method, it is preferable to use an In—Sn—Zn-based oxide target having the following atomic ratio of the metal elements:the atomic ratio of In:Sn:Zn is 1:1:1, 2:1:3, 1:2:2, or 4:9:7.

Specifically, the oxide semiconductor film can be formed as follows: the substrate is held in the chamber with pressure reduced, residual moisture in the chamber is removed, a sputtering gas from which hydrogen and moisture are removed is introduced, and the above-described target is used. The substrate temperature can be 100° C. to 600° C., preferably 200° C. to 400° C. in deposition. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

Note that the oxide semiconductor film formed by sputtering or the like contains a large amount of moisture or hydrogen (containing a hydroxyl group) as an impurity in some cases. Moisture and hydrogen easily form a donor level and thus serve as impurities in the oxide semiconductor. Thus, in one mode of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor film, moisture or hydrogen in the oxide semiconductor film can be eliminated. Specifically, heat treatment can be performed at a temperature higher than or equal to 250° C. and lower than or equal to 750° C., preferably higher than or equal to 400° C. and lower than the strain point of a substrate. For example, heat treatment can be performed at 500° C. for approximately three minutes to six minutes. When an RTA method is used for the heat treatment, dehydration or dehydrogenation can be performed in a short time; therefore, treatment can be performed even at a temperature higher than the strain point of a glass substrate.

Note that in some cases, the heat treatment makes oxygen released from the oxide semiconductor film and oxygen vacancies are formed in the oxide semiconductor film. In this case, it is preferable that treatment for supplying oxygen to the oxide semiconductor film be performed after the heat treatment, whereby reducing oxygen vacancies.

For example, by heat treatment performed in an atmosphere containing oxygen, oxygen can be supplied to the oxide semiconductor film. Heat treatment for supplying oxygen can be performed under conditions similar to those of the above heat treatment for reducing the concentration of moisture or hydrogen. Note that heat treatment for supplying oxygen is performed in an atmosphere containing oxygen, such as an oxygen gas or an ultra dry air atmosphere (the moisture content is lower than or equal to 20 ppm (−55° C. by conversion into a dew point), preferably lower than or equal to 1 ppm, further preferably lower than or equal to 10 ppb, in the measurement with use of a dew point meter of a cavity ring down laser spectroscopy (CRDS) system).

It is preferable that in the gas containing oxygen, the concentration of water or hydrogen be low. Specifically, the concentration of impurities in the oxygen gas is lower than or equal to 1 ppm, preferably lower than or equal to 0.1 ppm.

Alternatively, as a method for supplying oxygen to the oxide semiconductor film, an ion implantation method, an ion doping method, a plasma immersion ion implantation method, plasma treatment, or the like can be used. If a crystal part included in the oxide semiconductor film is damaged after oxygen is supplied to the oxide semiconductor film, heat treatment can be performed so that the damaged crystal part is repaired.

An insulating film containing oxygen can be used as an insulating film, such as a gate insulating film which is in contact with the oxide semiconductor film so that oxygen is supplied from the insulating film to the oxide semiconductor film. The oxygen-containing insulating layer is preferably made to contain oxygen in a proportion higher than that in the stoichiometric composition by heat treatment in an oxygen atmosphere, oxygen doping, or the like. "Oxygen doping" refers to addition of oxygen into a semiconductor film. In addition, "oxygen doping" includes oxygen plasma doping by which oxygen plasma is added to a semiconductor film. The oxygen doping may be performed by ion implantation or ion doping. By oxygen doping treatment, an insulating film that includes a region where the proportion of oxygen is higher than that in the stoichiometric composition can be formed. Then, a heat treatment is performed after formation of the insulating film including oxygen, so that oxygen is supplied from the insulating film to the oxide semiconductor film. With the above structure, oxygen vacancies serving as donors can be reduced in the oxide semiconductor film and the stoichiometric composition of the oxide semiconductor included in the oxide semiconductor film can be satisfied. It is preferable that the proportion of oxygen in the oxide semiconductor film is higher than that in the stoichiometric composition. As a result, the oxide semiconductor film can be made substantially i-type and variation in electrical characteristics of the transistors due to oxygen vacancies can be reduced; thus, electrical characteristics can be improved.

The heat treatment for supplying oxygen from the insulating film to the oxide semiconductor film is performed in a nitrogen atmosphere, ultra-dry air, or a rare gas (e.g., argon or helium) atmosphere preferably at temperatures ranging from 200° C. to 400° C., for example, from 250° C. to 350° C. It is preferable that the water content in the gas be 20 ppm or less, preferably 1 ppm or less, further preferably 10 ppb or less.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

For example, the CAAC-OS film is formed by a sputtering method with a polycrystalline metal oxide target. When ions collide with the target, a crystal region included in the sputtering target may be separated from the target along an a-b plane; in other words, a sputtered particle having a plane parallel to an a-b plane (flat-plate-like sputtered particle or pellet-like sputtered particle) may flake off from the target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the treatment chamber is reduced. Furthermore, the concentration of impurities in a deposition gas is reduced. Specifically, a deposition gas whose dew point is −80° C. or lower, preferably −100° C. or lower is used.

By increasing the substrate heating temperature during the deposition, migration of a sputtered particle occurs after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder can be determined as appropriate depending on the manufactured target.

Embodiment 4

In the light-emitting device according to one embodiment of the present invention, a color filter method can be employed, in which full-color images are displayed by using a combination of a color filter and a light-emitting element which emits light of a single color such as white. Alternatively, it is possible to employ a method in which full-color images are displayed by using a plurality of light-emitting elements which emit light of different hues. This method is referred to as side-by-side method because EL layers, which are each placed between a pair of electrodes in a light-emitting element, are separately colored with their corresponding colors.

In the side-by-side method, in general, EL layers are separately applied by vapor deposition with the use of a mask such as a metal mask. Thus, the size of pixels depends on the accuracy of side-by-side technique for the EL layers by vapor deposition. On the other hand, unlike the side-by-side method, EL layers do not need to be separately applied in the color filter method. Accordingly, pixels can be downsized more easily than in the side-by-side method; thus, a high-definition pixel portion can be realized.

A light-emitting device includes, in its category, a bottom-emission light-emitting device in which light emitted from a light-emitting element is extracted from an element substrate, over which a transistor is formed; and a top-emission light-emitting device in which light emitted from a light-emitting element is extracted from a side opposite to an element substrate. In the top-emission light-emitting device, light emitted from a light-emitting element is not blocked by elements such as a wiring, a transistor, or a capacitor, so that the efficiency of light extraction from a pixel can be made higher than that in the bottom-emission light-emitting device. Accordingly, the top-emission structure can achieve high luminance even when the amount of current supplied to the light-emitting element is reduced, and therefore is advantageous in improving lifetime of a light-emitting element.

The light-emitting device according to one embodiment of the present invention may have a microcavity (micro optical resonator) structure in which light emitted from an EL layer resonates within a light-emitting element. With the microcavity structure, light having a specific wavelength can be extracted from the light-emitting element with high efficiency, so that the luminance and the color purity of the pixel portion can be improved.

Figure 7:
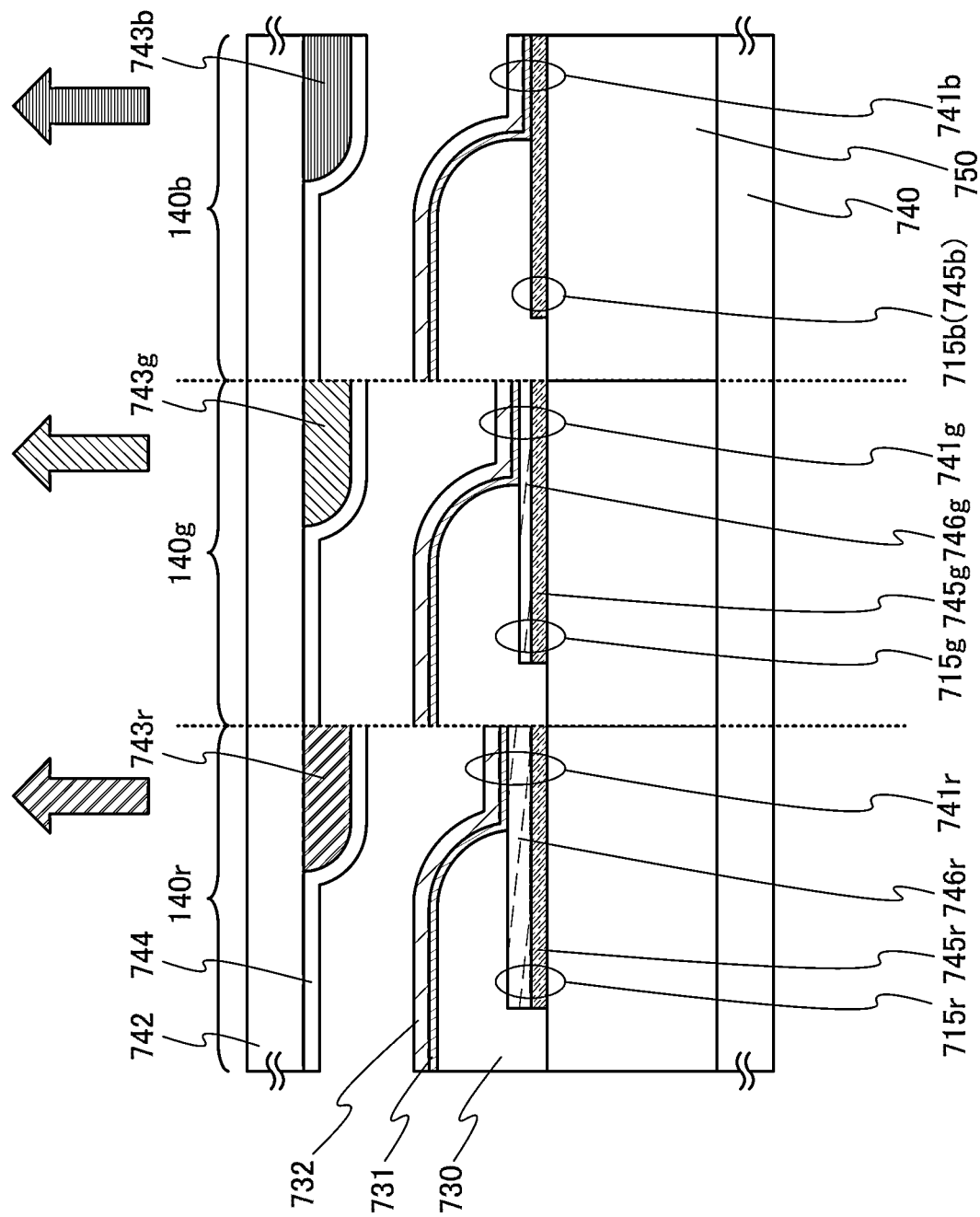
FIG. 7 is a cross-sectional view of a pixel.

FIG. 7 is an example of a cross-sectional view of pixels. FIG. 7 illustrates part of a cross section of a pixel corresponding to red, part of a cross section of a pixel corresponding to green, and part of a cross section of a pixel corresponding to blue.

Specifically, FIG. 7 shows a pixel 140r emitting red light, a pixel 140g emitting green light, and a pixel 140b emitting blue light. The pixel 140r, the pixel 140g, and the pixel 140b include an anode 715r, an anode 715g, and an anode 715b, respectively. The anodes 715r, 715g, and 715b included in the pixels 140r, 140g, and 140b are provided over an insulating film 750 formed over a substrate 740.

A partition 730 formed using an insulating film is provided over the anodes 715r, 715g, and 715b. The partition 730 has openings, where parts of the anodes 715r, 715g, and 715b are exposed. An EL layer 731 and a cathode 732 that transmits visible light are stacked in this order over the partition 730 so as to cover the above exposed parts.

A portion where the anode 715r, the EL layer 731, and the cathode 732 overlap with one another corresponds to a light-emitting element 741r corresponding to red. A portion where the anode 715g, the EL layer 731, and the cathode 732 overlap with one another corresponds to a light-emitting element 741g corresponding to green. A portion where the anode 715b, the EL layer 731, and the cathode 732 overlap with one another corresponds to a light-emitting element 741b corresponding to blue.

In addition, a substrate 742 is provided to face the substrate 740 with the light-emitting elements 741r, 741g, and 741b interposed therebetween. A coloring layer 743r corresponding to the pixel 140r, a coloring layer 743g corresponding to the pixel 140g, and a coloring layer 743b corresponding to the pixel 140b are provided on the substrate 742. The coloring layer 743r is a layer whose transmittance of light in a wavelength range corresponding to red is higher than that of light in other wavelength ranges, the coloring layer 743g is a layer whose transmittance of light in a wavelength range corresponding to green is higher than that of light in other wavelength ranges, and the coloring layer 743b is a layer whose transmittance of light in a wavelength range corresponding to blue is higher than that of light in other wavelength ranges.

Further, an overcoat 744 is provided on the substrate 742 so as to cover the coloring layers 743r, 743g, and 743b. The overcoat 744 is a layer which transmits visible light and is provided for protecting the coloring layers 743r, 743g, and 743b, and a resin material with which planarity can be improved is preferably used therefor. The coloring layers 743r, 743g, and 743b and the overcoat 744 may be collectively regarded as a color filter, or each of the coloring layers 743r, 743g, and 743b may be regarded as a color filter.

In FIG. 7, a conductive film 745r with high visible-light reflectance and a conductive film 746r with higher visible-light transmittance than the conductive film 745r are stacked in this order to be used as the anode 715r. A conductive film 745g with high visible-light reflectance and a conductive film 746g with higher visible-light transmittance than the conductive film 745g are stacked in this order to be used as the anode 715g. A first region of the conductive film 746g has a smaller thickness than a second region of the conductive film 746r. A conductive film 745b with high visible-light reflectance is used as the anode 715b.

Thus, in the light-emitting device in FIG. 7, the optical path length of light emitted from the EL layer 731 in the light-emitting element 741r can be adjusted by the distance between the conductive film 745r and the cathode 732. The optical path length of light emitted from the EL layer 731 in the light-emitting element 741g can be adjusted by the distance between the conductive film 745g and the cathode 732. The optical path length of light emitted from the EL layer 731 in the light-emitting element 741b can be adjusted by the distance between the conductive film 745b and the cathode 732.

In one embodiment of the present invention, a microcavity structure may be employed, in which the above optical path lengths are adjusted in accordance with the wavelengths of light emitted from the light-emitting elements 741r, 741g, and 741b so that light emitted from the EL layer 731 resonates within each light-emitting element.

When the above microcavity structure is applied to the light-emitting device according to one embodiment of the present invention, light having a wavelength corresponding to red, of light emitted from the light-emitting element 741r, is increased in intensity by being resonated. Consequently, the color purity and the luminance of red light obtained through the coloring layer 743r are increased. Light having a wavelength corresponding to green, of light emitted from the light-emitting element 741g, is increased in intensity by being resonated. Consequently, the color purity and the luminance of green light obtained through the coloring layer 743g are increased. Light having a wavelength corresponding to blue, of light emitted from the light-emitting element 741b, is increased in intensity by being resonated. Consequently, the color purity and the luminance of blue light obtained through the coloring layer 743b are increased.

FIG. 7 shows a structure in which pixels emitting three colors of red, green, and blue are used; however, one embodiment of the present invention is not limited to the structure. In one embodiment of the present invention, a combination of four colors of red, green, blue, and yellow or a combination of three colors of cyan, magenta, and yellow may be used. Alternatively, the combination of the colors may include six colors of pale red, pale green, pale blue, deep red, deep green, and deep blue. Alternatively, the combination of the colors may be six colors of red, green, blue, cyan, magenta, and yellow.

In FIG. 7, the conductive film 745b with high visible-light reflectance is used as the anode in the light-emitting element 741b which emits light with the shortest wavelength $\lambda$ among the light-emitting elements 741r, 741g, and 741b, and the conductive films 746r and 746g including regions having different thicknesses are used in the other light-emitting elements 741r and 741g; thus, the optical path lengths are adjusted. In one embodiment of the present invention, a conductive film with high visible-light transmittance, like the conductive films 746r and 746g, may be provided over the conductive film 745b with high visible-light reflectance also in the light-emitting element 741b which emits light with the shortest wavelength $\lambda$. However, it is preferable to use the conductive film 745b with high visible-light reflectance as the anode of the light-emitting element 741b which emits light with the shortest wavelength $\lambda$ as shown in FIG. 7, because the fabrication process of the anode can be simplified as compared to the case of using a conductive film with high visible-light transmittance for the anodes of all the light-emitting elements.

Note that in many cases, the work function of the conductive film 745b having high visible-light reflectance is smaller than those of the conductive films 746r and 746g having high visible-light transmittance. Accordingly, in the light-emitting element 741b which emits light with the shortest wavelength 1, holes are less likely to be injected from the anode 715b into the EL layer 731 than in the light-emitting elements 741r and 741g, resulting in low emission efficiency. In view of this, in one embodiment of the present invention, a composite material that contains a substance having a high hole-transport property and a substance having an acceptor property (electron-accepting property) with respect to the substance having a high hole-transport property is preferably used for part of the EL layer 731 that is in contact with the conductive film 745b with high visible-light reflectance in the light-emitting element 741b which emits light with the shortest wavelength $\lambda$. When the above composite material is formed to be in contact with the anode 715b, holes can be easily injected from the anode 715b into the EL layer 731, so that the emission efficiency of the light-emitting element 741b can be increased.

As the substance having an acceptor property, 7,7,8,8-tetracyano-2,3,5,6-tetrafluoroquinodimethane (abbreviation: $F_4$-TCNQ), chloranil, and the like can be given. In addition, a transition metal oxide can be given. Further, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable because of their high acceptor property. Among these, molybdenum oxide is especially preferable since it is stable in the air and its hygroscopic property is low and is easily treated.

As the substance having a high hole-transport property used for the composite material, any of a variety of compounds such as an aromatic amine compound, a carbazole derivative, aromatic hydrocarbon, or a high molecular weight compound (e.g., an oligomer, a dendrimer, or a polymer) can be used. The organic compound used for the composite material is preferably an organic compound having a high hole-transport property. Specifically, a substance having a hole mobility of $10^{-6}$ cm$^2$/Vs or higher is preferably used. However, other substances than the above-described materials may also be used as long as the substances have higher hole-transport properties than electron-transport properties.

The conductive films 745r, 745g, and 745b having high visible-light reflectance can be formed using a single layer or a stacked layer using aluminum, silver, an alloy containing such a metal material, or the like, for example. Alternatively, the conductive films 745r, 745g, and 745b may be formed by stacking a conductive film having high visible-light reflectance and a thin conductive film (preferably with a thickness of 20 nm or less, further preferably 10 nm or less). For example, a thin titanium film or a thin molybdenum film is stacked over a conductive film with high visible-light reflectance to form the conductive film 745b, so that an oxide film can be prevented from being formed on a surface of the conductive film with high visible-light reflectance (e.g., aluminum, an alloy containing aluminum, or silver).

For the conductive films 746r and 746g having high visible-light transmittance, for example, indium oxide, tin oxide, zinc oxide, indium tin oxide, indium zinc oxide, or the like can be used.

The cathode 732 can be formed, for example, by stacking a conductive film thin enough to transmit light (preferably with a thickness of 20 nm or less, further preferably 10 nm or less) and a conductive film including a conductive metal oxide. The conductive film thin enough to transmit light can be formed using a single layer or a stacked layer using silver, magnesium, an alloy containing such a metal material, or the like. As the conductive metal oxide, it is possible to use indium oxide, tin oxide, zinc oxide, indium oxide-tin oxide, indium oxide-zinc oxide, or any of these metal oxide materials containing silicon oxide.

This embodiment can be implemented combining with another embodiment as appropriate.

Embodiment 5

In this embodiment, a bottom-emission structure, a top-emission structure, and a dual-emission structure are described. In the dual-emission structure, light from a light-emitting element is extracted from the element substrate side and the side opposite to the element substrate.

Figure 8A:
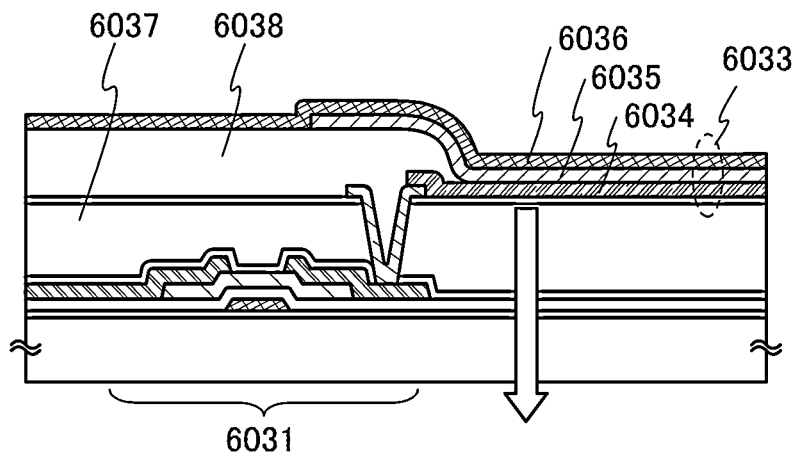
FIGS. 8A to 8C are cross-sectional views of a pixel.

FIG. 8A is a cross-sectional view of a pixel in which light emitted from a light-emitting element 6033 is extracted from an anode 6034 side. A transistor 6031 is covered with an insulating film 6037, and over the insulating film 6037, a partition 6038 having an opening is formed. In the opening of the partition 6038, the anode 6034 is partially exposed, and the anode 6034, an EL layer 6035, and a cathode 6036 are stacked in this order in the opening.

The anode 6034 is formed using a material through which light passes easily or formed to a thickness such that light passes through the anode 6034 easily. The cathode 6036 is formed using a material through which light is difficult to pass or formed to a thickness such that light is difficult to pass through the cathode 6036. Accordingly, it is possible to obtain a bottom-emission structure in which light is extracted from the anode 6034 side as indicated by an outline arrow.

Figure 8B:
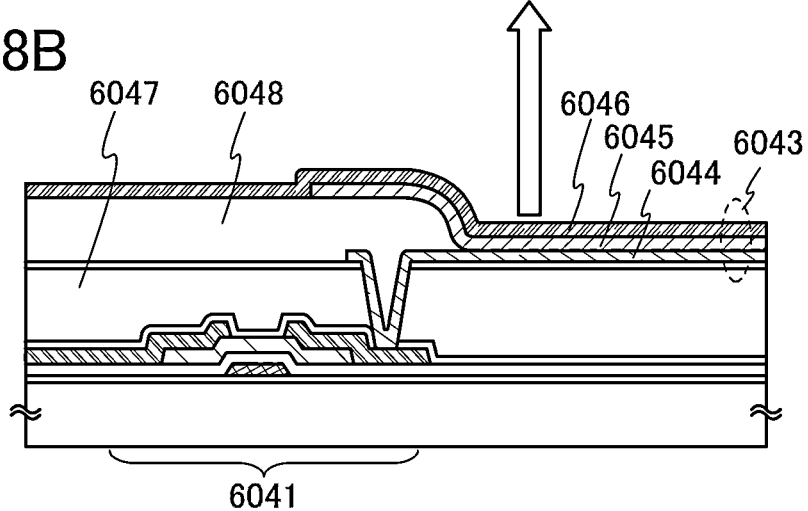

FIG. 8B is a cross-sectional view of a pixel in which light emitted from a light-emitting element 6043 is extracted from a cathode 6046 side. The transistor 6041 is covered with an insulating film 6047, and over the insulating film 6047, a partition 6048 having an opening is formed. In the opening of the partition 6048, an anode 6044 is partly exposed, and the anode 6044, an EL layer 6045, and the cathode 6046 are stacked in this order in the opening.

The anode 6044 is formed using a material through which light is difficult to pass or formed to a thickness such that light is difficult to pass through the anode 6044. The cathode 6046 is formed using a material through which light passes easily or formed to a thickness such that light passes through the cathode 6046 easily. Accordingly, it is possible to obtain a top-emission structure in which light is extracted from the cathode 6046 side as indicated by an outline arrow.

Figure 8C:
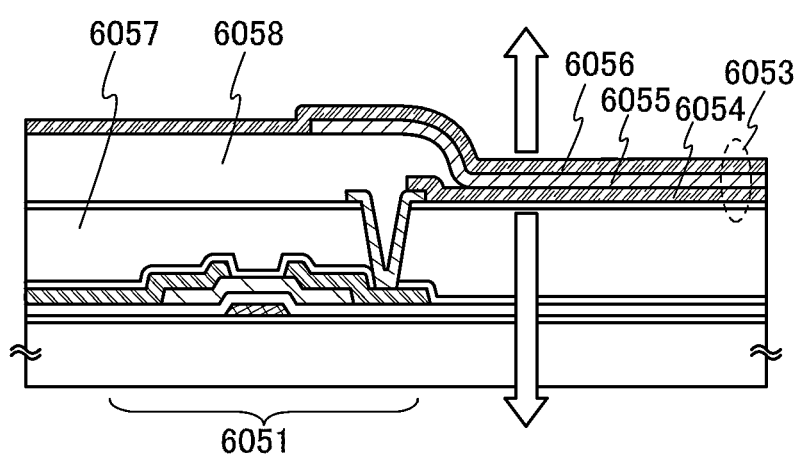

FIG. 8C is a cross-sectional view of a pixel in which light emitted from a light-emitting element 6053 is extracted from an anode 6054 side and a cathode 6056 side. The transistor 6051 is covered with an insulating film 6057, and over the insulating film 6057, a partition 6058 having an opening is formed. In the opening of the partition 6058, the anode 6054 is partially exposed, and the anode 6054, an EL layer 6055, and the cathode 6056 are stacked in this order in the opening.

The anode 6054 and the cathode 6056 are formed using a material through which light passes easily or formed to a thickness such that light passes through the anode 6054 and the cathode 6056 easily. Accordingly, it is possible to obtain a dual-emission structure in which light is extracted from the anode 6054 side and the cathode 6056 side as indicated by outline arrows.

For the electrodes serving as the anode and the cathode, any of metals, alloys, electrically conductive compounds, and mixtures thereof can be used, for example. Specifically, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as magnesium (Mg), calcium (Ca), or strontium (Sr), an alloy containing such an element (MgAg, AlLi), a rare earth metal such as europium (Eu) or ytterbium (Yb), an alloy containing such an element, graphene, and the like can be used. The electrodes are formed using materials selected from the above as appropriate and formed to have an optimal thickness, thereby achieving a bottom-emission structure, a top-emission structure, or a dual-emission structure.

This embodiment can be combined with any of the other embodiments as appropriate.

Embodiment 6

Figure 9:
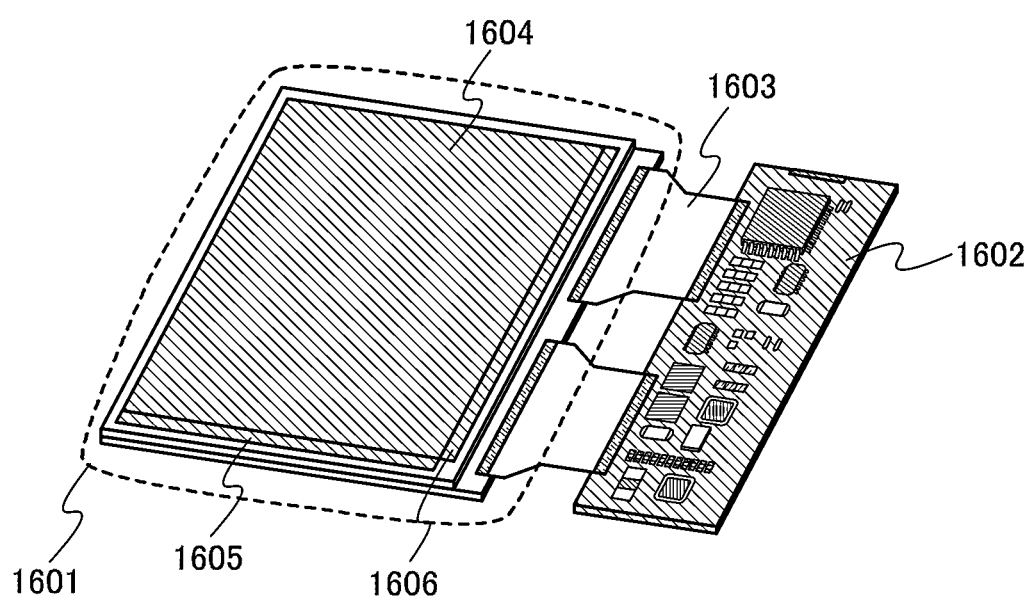
FIG. 9 is a perspective view of a light-emitting device.

FIG. 9 illustrates an example of a perspective view of the light-emitting device in accordance with one embodiment of the present invention.

The light-emitting device shown in FIG. 9 includes a panel 1601; a circuit board 1602 including a controller, an image processing circuit, an image memory, a CPU, and the like; and a connection portion 1603. The panel 1601 includes a pixel portion 1604 including a plurality of pixels, a scan line driver circuit 1605 that selects pixels per row, and a signal line driver circuit 1606 that controls input of the signal Sig1 or the signal Sig2 to the pixels in a selected row.

Various signals and power supply potentials are input to the panel 1601 through the connection portions 1603 from the circuit board 1602. For the connection portions 1603, a flexible printed circuit (FPC) or the like can be used. In the case where a COF tape is used as the connection portion 1603, part of the circuit in the circuit board 1602 or part of the scan line driver circuit 1605 or the signal line driver circuit 1606 included in the panel 1601 may be formed on a chip separately prepared, and the chip may be connected to a COF tape by a COF (chip on film) method.

This embodiment can be combined with any of the other embodiments as appropriate.

Embodiment 7

A light-emitting device according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the light-emitting device according to one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. Specific examples of such electronic devices are shown in FIGS. 10A to 10E.

Figure 10A:
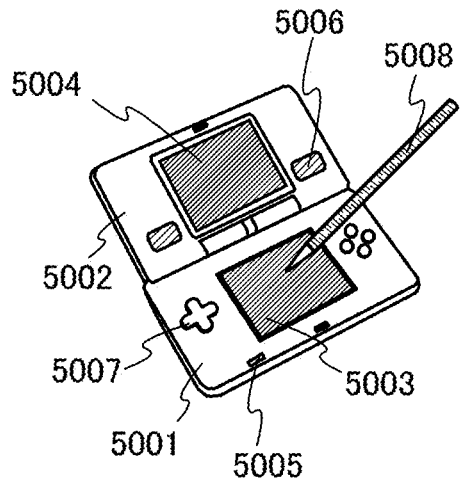
FIGS. 10A to 10E are diagrams of electronic devices.

FIG. 10A illustrates a portable game machine including a housing 5001, a housing 5002, a display portion 5003, a display portion 5004, a microphone 5005, speakers 5006, operation keys 5007, and a stylus 5008. A light-emitting device according one embodiment of the present invention can be used for the display portion 5003 or the display portion 5004. Although the portable game machine in FIG. 10A has the two display portions 5003 and 5004, the number of display portions of a portable game machine is not limited to this.

Figure 10B:
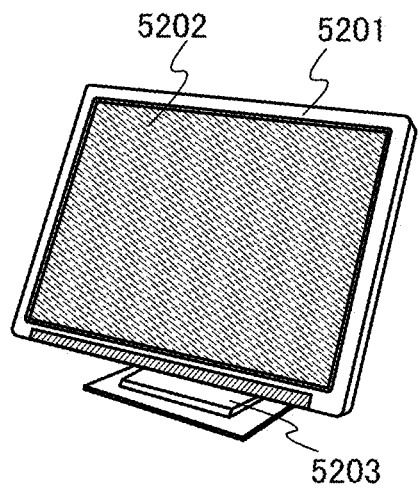

FIG. 10B illustrates a display device including a housing 5201, a display portion 5202, a support base 5203, and the like. A light-emitting device according one embodiment of the present invention can be used for the display portion 5202. Note that a display device includes, in its category, any display device for displaying information, such as display devices for personal computers, TV broadcast reception, and advertisement.

Figure 10C:
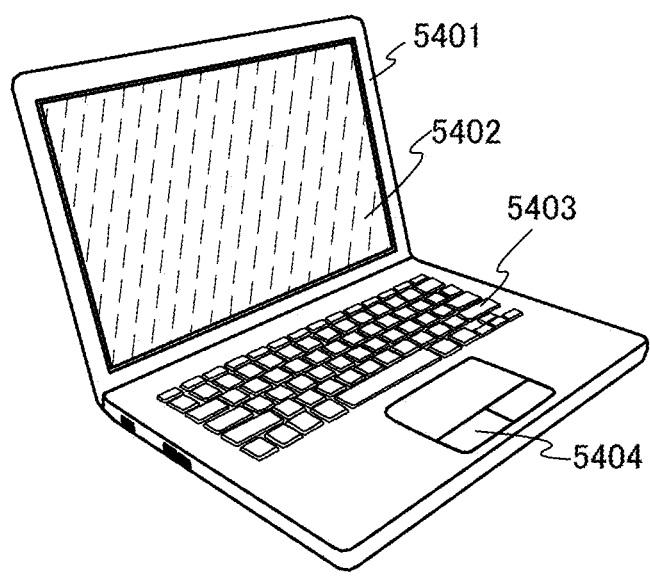

FIG. 10C illustrates a laptop including a housing 5401, a display portion 5402, a keyboard 5403, a pointing device 5404, and the like. A light-emitting device according one embodiment of the present invention can be used for the display portion 5402.

Figure 10D:
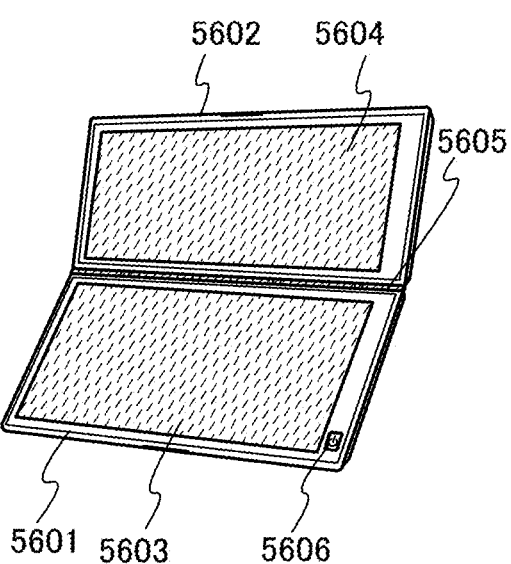

FIG. 10D illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle formed by the first housing 5601 and the second housing 5602 is variable with the joint 5605. An image on the first display portion 5603 may be switched depending on the angle formed by the first housing 5601 and the second housing 5602 at the joint 5605. A light-emitting device with a position input function may be used as at least one of the first display portion 5603 and the second display portion 5604. Note that the position input function can be added by provision of a touch panel in a light-emitting device. Alternatively, the position input function can be added by provision of a photoelectric conversion element called a photosensor in a pixel portion of a light-emitting device. A light-emitting device according one embodiment of the present invention can be used for the first display portion 5603 or the second display portion 5604.

Figure 10E:
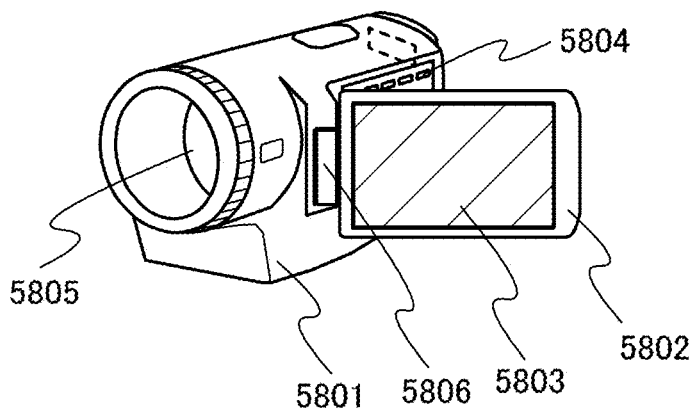

FIG. 10E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 is connected to the second housing 5802 by the joint 5806, and the angle formed by the first housing 5801 and the second housing 5802 can be varied by the joint 5806. The image displayed on the display portion 5803 may be switched depending on the angle formed by the first housing 5801 and the second housing 5802 at the joint 5806. A light-emitting device according one embodiment of the present invention can be used for the display portion 5803.

This embodiment can be combined with any of the other embodiments as appropriate.

EXPLANATION OF REFERENCE

100: light-emitting device, 101: pixel, 102: pixel portion, 103: panel, 104: controller, 105: power circuit, 106: light-emitting element, 107: transistor, 108: transistor, 109: wiring, 110: wiring, 111: wiring, 112: capacitor, 120: input device, 121: CPU, 122: image processing circuit, 123: image memory, 124: signal line driver circuit, 125: scan line driver circuit, 126: image data, 130: transistor, 131: transistor, 132: transistor, 133: wiring, 134: wiring, 135: wiring, 136: wiring, 137: wiring, 138: wiring, 139: transistor, 140*b*: pixel, 140*g*: pixel, 140*r*: pixel, 715*b*: anode, 715*g*: anode, 715*r*: anode, 730: partition, 731: EL layer, 732: cathode, 740: substrate, 741*b*: light-emitting element, 741*g*: light-emitting element, 741*r*: light-emitting element, 742: substrate, 743*b*: coloring layer, 743*g*: coloring layer, 743*r*: coloring layer, 744: overcoat, 745*b*: conductive film, 745*g*: conductive film, 745*r*: conductive film, 746*g*: conductive film, 746*r*: conductive film, 750: insulating film, 1601: panel, 1602: circuit substrate, 1603: connection portion, 1604: pixel portion, 1605: scan line driver circuit, 1606: signal line driver circuit, 5001: housing, 5002: housing, 5003: display portion, 5004: display portion, 5005: microphone, 5006: speaker, 5007: operation key, 5008: stylus, 5201: housing, 5202: display portion, 5203: support base, 5401: housing, 5402: display portion, 5403: keyboard, 5404: pointing device, 5601: housing, 5602: housing, 5603: display portion, 5604: display portion, 5605: connection portion, 5606: operation key, 5801: housing, 5802: housing, 5803: display portion, 5804: operation key, 5805: lens, 5806: connection portion, 6031: transistor, 6033: light-emitting element, 6034: anode, 6035: EL layer, 6036: cathode, 6037: insulating film, 6038: partition, 6041: transistor, 6043: light-emitting element, 6044: anode, 6045: EL layer, 6046: cathode, 6047: insulating film, 6048: partition, 6051: transistor, 6053: light-emitting element, 6054: anode, 6055: EL layer, 6056: cathode, 6057: insulating film, 6058: partition This application is based on Japanese Patent Application serial No. 2012-055269 filed with Japan Patent Office on Mar. 13, 2012 and Japanese Patent Application serial No. 2012-261864 filed with Japan Patent Office on Nov. 30, 2012, the entire contents of which are hereby incorporated by reference.

The invention claimed is:

1. A light-emitting device comprising:
   a panel including:
      a source driver; and
      a pixel portion including a plurality of pixels;
   a CPU;
   a controller; and
   a power supply circuit,
   wherein the CPU is configured to receive an instruction to transfer the pixel portion from an operation state to a non-operation state,
   wherein according to the instruction, the CPU is configured to provide instructions to the controller to input a signal for initializing to the plurality of pixels and cut supply of a power voltage to the panel,
   wherein the controller is configured to control the source driver so that one of an image signal and the signal for initializing is supplied to the plurality of pixels,
   wherein the power supply circuit is configured to provide the supply of the power voltage to the panel when the image signal is supplied to the plurality of pixels, and cut the supply of the power voltage to the panel after the signal for initializing is supplied to the plurality of pixels,
   wherein the plurality of pixels each include a first transistor, a second transistor, and a light-emitting element,
   wherein the second transistor is turned off when the signal for initializing is supplied to a gate electrode of the second transistor through the first transistor, and
   wherein the light-emitting element is configured to be supplied with the power voltage through the second transistor.

2. The light-emitting device according to claim 1, wherein an off-state current density of the first transistor is lower than or equal to 100 zA/μm.

3. The light-emitting device according to claim 1, wherein the signal for initializing does not include image data.

4. The light-emitting device according to claim 1, wherein the gate electrode of the second transistor is configured to be applied with one of the image signal and the signal for initializing.

5. The light-emitting device according to claim 1,
   wherein the plurality of pixels each include a third transistor, a fourth transistor, a fifth transistor, and a sixth transistor,
   wherein each of channel formation regions of the first transistor, the third transistor, and the fourth transistor includes an oxide semiconductor,
   wherein the gate electrode of the second transistor, one of source and drain electrodes of the third transistor, and one of source and drain electrodes of the fourth transistor are electrically connected to each other,
   wherein the other of the source and drain electrodes of the fourth transistor is electrically connected to one of source and drain electrodes of the first transistor,
   wherein one of source and drain electrodes of the fifth transistor is electrically connected to one of source and drain electrodes of the second transistor, and one of source and drain electrodes of the sixth transistor, and
   wherein the other of the source and drain electrodes of the fifth transistor is electrically connected to the light-emitting element.

6. The light-emitting device according to claim 5, wherein a gate electrode of the sixth transistor is electrically connected to a wiring which is not electrically connected to the first transistor and the third transistor.

7. A light-emitting device comprising:
   a panel including:
      a source driver; and
      a pixel portion including a plurality of pixels;
   a CPU;
   a controller; and
   a power supply circuit,
   wherein the CPU is configured to receive an instruction to transfer the pixel portion from a non-operation state to an operation state,
   wherein according to the instruction, the CPU is configured to provide instructions to the controller to input a signal for initializing to the plurality of pixels and provide supply of a power voltage to the panel,
   wherein the controller is configured to control the source driver so that one of an image signal and the signal for initializing is supplied to the plurality of pixels,
   wherein the power supply circuit is configured to cut the supply of the power voltage to the panel,
   wherein the power supply circuit is configured to provide the supply of the power voltage to the panel after the signal for initializing is supplied to the plurality of pixels and before the image signal is supplied to the plurality of pixels,
   wherein the plurality of pixels each include a first transistor, a second transistor, and a light-emitting element,
   wherein the second transistor is turned off when the signal for initializing is supplied to a gate electrode of the second transistor through the first transistor, and
   wherein the light-emitting element is configured to be supplied with the power voltage through the second transistor.

8. The light-emitting device according to claim 7, wherein an off-state current density of the first transistor is lower than or equal to 100 zA/μm.

9. The light-emitting device according to claim 7, wherein the signal for initializing does not include image data.

10. The light-emitting device according to claim 7, wherein the gate electrode of the second transistor is configured to be applied with one of the image signal and the signal for initializing.

11. The light-emitting device according to claim 2,
wherein the plurality of pixels each include a third transistor, a fourth transistor, a fifth transistor, and a sixth transistor,
wherein each of channel formation regions of the first transistor, the third transistor, and the fourth transistor includes an oxide semiconductor,
wherein the gate electrode of the second transistor, one of source and drain electrodes of the third transistor, and one of source and drain electrodes of the fourth transistor are electrically connected to each other,
wherein the other of the source and drain electrodes of the fourth transistor is electrically connected to one of source and drain electrodes of the first transistor,
wherein one of source and drain electrodes of the fifth transistor is electrically connected to one of source and drain electrodes of the second transistor, and one of source and drain electrodes of the sixth transistor, and
wherein the other of the source and drain electrodes of the fifth transistor is electrically connected to the light-emitting element.

12. The light-emitting device according to claim 11, wherein a gate electrode of the sixth transistor is electrically connected to a wiring which is not electrically connected to the first transistor and the third transistor.

13. A method for driving a light-emitting device;
the light-emitting device comprising a pixel portion including a plurality of pixels including a first transistor, a second transistor, and a light-emitting element,
the method comprising the steps of:
receiving an instruction to transfer the pixel portion from an operation state to a non-operation state,
providing instructions to input a signal for initializing to the plurality of pixels and cut supply of a power voltage to the plurality of pixels according to the instruction,
supplying an image signal to a gate electrode of the second transistor through the first transistor;
supplying the signal for initializing to the gate electrode of the second transistor through the first transistor to turn the second transistor off; and
cutting the supply of the power voltage to the plurality of pixels, wherein the second transistor controls the supply of the power voltage to the light-emitting element.

14. The method according to claim 13,
wherein the plurality of pixels each include a third transistor, a fourth transistor, a fifth transistor, and a sixth transistor,
wherein each of channel formation regions of the first transistor, the third transistor, and the fourth transistor includes an oxide semiconductor,
wherein the gate electrode of the second transistor, one of source and drain electrodes of the third transistor, and one of source and drain electrodes of the fourth transistor are electrically connected to each other,
wherein the other of the source and drain electrodes of the fourth transistor is electrically connected to one of source and drain electrodes of the first transistor,
wherein one of source and drain electrodes of the fifth transistor is electrically connected to one of source and drain electrodes of the second transistor, and one of source and drain electrodes of the sixth transistor, and
wherein the other of the source and drain electrodes of the fifth transistor is electrically connected to the light-emitting element.

15. The method for driving a light-emitting device according to claim 14, wherein a gate electrode of the sixth transistor is electrically connected to a wiring which is not electrically connected to the first transistor and the third transistor.

16. The method according to claim 13, wherein the signal for initializing does not include image data.

17. A method for driving a light-emitting device;
the light-emitting device comprising a pixel portion including a plurality of pixels each including a first transistor, a second transistor, and a light-emitting element,
the method comprising the steps of:
receiving an instruction to transfer the pixel portion from a non-operation state to an operation state,
providing instructions to input a signal for initializing to the plurality of pixels and provide supply of a power voltage to the plurality of pixels according to the instruction,
supplying an image signal to a gate electrode of the second transistor through the first transistor;
supplying the signal for initializing to the gate electrode of the second transistor through the first transistor to turn the second transistor off, and providing the supply of the power voltage to the plurality of pixels,
wherein the second transistor controls the supply of the power voltage to the light-emitting element.

18. The method according to claim 17,
wherein the plurality of pixels each include a third transistor, a fourth transistor, a fifth transistor, and a sixth transistor,
wherein each of channel formation regions of the first transistor, the third transistor, and the fourth transistor includes an oxide semiconductor,
wherein the gate electrode of the second transistor, one of source and drain electrodes of the third transistor, and one of source and drain electrodes of the fourth transistor are electrically connected to each other,
wherein the other of the source and drain electrodes of the fourth transistor is electrically connected to one of source and drain electrodes of the first transistor,
wherein one of source and drain electrodes of the fifth transistor is electrically connected to one of source and drain electrodes of the second transistor, and one of source and drain electrodes of the sixth transistor, and
wherein the other of the source and drain electrodes of the fifth transistor is electrically connected to the light-emitting element.

19. The method for driving a light-emitting device according to claim 18, wherein a gate electrode of the sixth transistor is electrically connected to a wiring which is not electrically connected to the first transistor and the third transistor.

20. The method according to claim 17, wherein the signal for initializing does not include image data.

* * * * *